US012777666B2

(12) United States Patent
Hong et al.

(10) Patent No.: US 12,777,666 B2
(45) Date of Patent: Oct. 27, 2026

(54) SEMICONDUCTOR DEVICES INCLUDING CAPACITOR STRUCTURE

(71) Applicant: SAMSUNG ELECTRONICS CO., LTD., Suwon-si (KR)

(72) Inventors: Yaejin Hong, Suwon-si (KR); Junrak Choi, Suwon-si (KR); Jinsu Lee, Suwon-si (KR); Jungwoo Kang, Suwon-si (KR); Yirang Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 18/505,035

(22) Filed: Nov. 8, 2023

(65) Prior Publication Data

US 2024/0234484 A1 Jul. 11, 2024

(30) Foreign Application Priority Data

Jan. 9, 2023 (KR) ........................ 10-2023-0002746

(51) Int. Cl.
*H10D 1/68* (2025.01)
*H10B 12/00* (2023.01)

(52) U.S. Cl.
CPC ........... *H10D 1/696* (2025.01); *H10B 12/315* (2023.02); *H10B 12/482* (2023.02); *H10B 12/485* (2023.02)

(58) Field of Classification Search
CPC .. H10B 12/033; H10B 12/315; H10B 12/482; H10B 12/485
See application file for complete search history.

(56) References Cited

U.S. PATENT DOCUMENTS 6,639,264 B1 10/2003 Loh
7,528,034 B2 5/2009 Nakayama
8,637,364 B2 * 1/2014 Ueda .................... H10B 12/033 257/E21.648
10,199,451 B2 2/2019 Ishizaka et al.
2006/0234510 A1 * 10/2006 Iijima .................. H10B 12/033 438/689
2007/0018217 A1 1/2007 Kawamura
2007/0040198 A1 2/2007 Matsuura
2007/0057306 A1 * 3/2007 Nakamura ............. H10D 1/694 257/E27.088
2009/0072349 A1 3/2009 Tak et al.
(Continued)

FOREIGN PATENT DOCUMENTS

KR 2000-0048085 7/2000
KR 10-0646922 11/2006
KR 10-0983945 9/2010

*Primary Examiner* — Khiem D Nguyen
(74) *Attorney, Agent, or Firm* — Morgan, Lewis & Bockius LLP

(57) ABSTRACT

A semiconductor device includes a substrate, a plurality of lower electrodes disposed on the substrate, a dielectric layer covering the lower electrodes and including a halogen element, and an upper electrode covering the dielectric layer. Each of the plurality of lower electrodes includes a first electrode layer, an insertion layer disposed on the first electrode layer, and a second electrode layer disposed on the first electrode layer and the insertion layer. The insertion layer includes an insertion material including a halogen element.

20 Claims, 20 Drawing Sheets

(56) References Cited

U.S. PATENT DOCUMENTS

| | | | | |
|---|---|---|---|---|
| 2012/0112317 | A1* | 5/2012 | Kang | H10B 12/033<br>257/532 |
| 2013/0175667 | A1* | 7/2013 | Kwon | H10D 1/716<br>257/532 |
| 2021/0125993 | A1* | 4/2021 | An | H10B 12/0335 |
| 2021/0193457 | A1 | 6/2021 | Park et al. | |

* cited by examiner

SEMICONDUCTOR DEVICES INCLUDING CAPACITOR STRUCTURE

CROSS-REFERENCE TO RELATED APPLICATION(S)

This U.S. patent application claims priority under 35 USC § 119 to Korean Patent Application No. 10-2023-0002746 filed on Jan. 9, 2023 in the Korean Intellectual Property Office, the disclosure of which is incorporated by reference in its entirety herein.

1. TECHNICAL FIELD

The present inventive concept relates to semiconductor devices.

2. DISCUSSION OF RELATED ART

Semiconductor memory is a digital electronic semiconductor device for digital data storage. Semiconductor memory may refer to devices in which data is stored within metal-oxide-semiconductor (MOS) memory cells on a silicon integrated circuit. An example of semiconductor memory includes a dynamic-random-access memory (DRAM), which uses a transistor and a MOS capacitor per cell. The MOS capacitor may be referred to as an information storage structure.

According to demand for high integration and miniaturization of semiconductor devices, the size of these information storage structures is also being miniaturized. However, as the information storage structure becomes smaller, so does the space for depositing a dielectric layer in the MOS capacitor. As a result, leakage current of the dielectric layer increases and defects of the semiconductor device may increase.

SUMMARY

Example embodiments provide a semiconductor device having increased electrical characteristics and reliability.

According to an example embodiment, a semiconductor device includes a substrate; a plurality of lower electrodes disposed on the substrate; a dielectric layer covering the lower electrodes and including a halogen element; and an upper electrode covering the dielectric layer. Each of the plurality of lower electrodes includes a first electrode layer; an insertion layer disposed on the first electrode layer; and a second electrode layer disposed on the first electrode layer and the insertion layer. The insertion layer includes an insertion material including a halogen element.

According to an example embodiment, a semiconductor device includes a substrate; a plurality of lower electrodes disposed on the substrate; a dielectric layer covering the lower electrodes; and an upper electrode covering the dielectric layer. Each of the plurality of lower electrodes includes a first electrode layer including a halogen element in a first concentration; a second electrode layer disposed on the first electrode layer; and an insertion layer disposed between the first electrode layer and the second electrode layer and surrounded by the first electrode layer and the second electrode layer, and including a halogen element of a second concentration higher than the first concentration.

According to an example embodiment, a semiconductor device includes a device isolation layer defining a plurality of active regions disposed on a substrate; a plurality of gate electrodes crossing the active regions and extending into the isolation layer; a plurality of first impurity regions and a plurality of second impurity regions disposed in the active regions, on both sides of the gate electrodes; a plurality of bit lines disposed on the gate electrodes and electrically connected to the first impurity regions; a plurality of conductive patterns disposed on side surfaces of the bit lines and electrically connected to the second impurity regions; a plurality of lower electrodes extending vertically on the conductive patterns and electrically connected to the respective conductive patterns; at least one support layer spaced apart from an upper surface of the substrate in a vertical direction, extending in a direction parallel to the upper surface of the substrate, and contacting respective side surfaces of the plurality of lower electrodes adjacent to each other; a dielectric layer covering the lower electrodes and the at least one support layer, and including fluorine (F); and an upper electrode covering the dielectric layer. Each of the lower electrodes includes a first electrode layer; an insertion layer buried in the first electrode layer and including fluorine (F); and a second electrode layer disposed on an upper surface of the insertion layer, and covering an upper surface of the first electrode layer and the upper surface of the insertion layer.

BRIEF DESCRIPTION OF DRAWINGS

The above and other aspects and features of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1A:
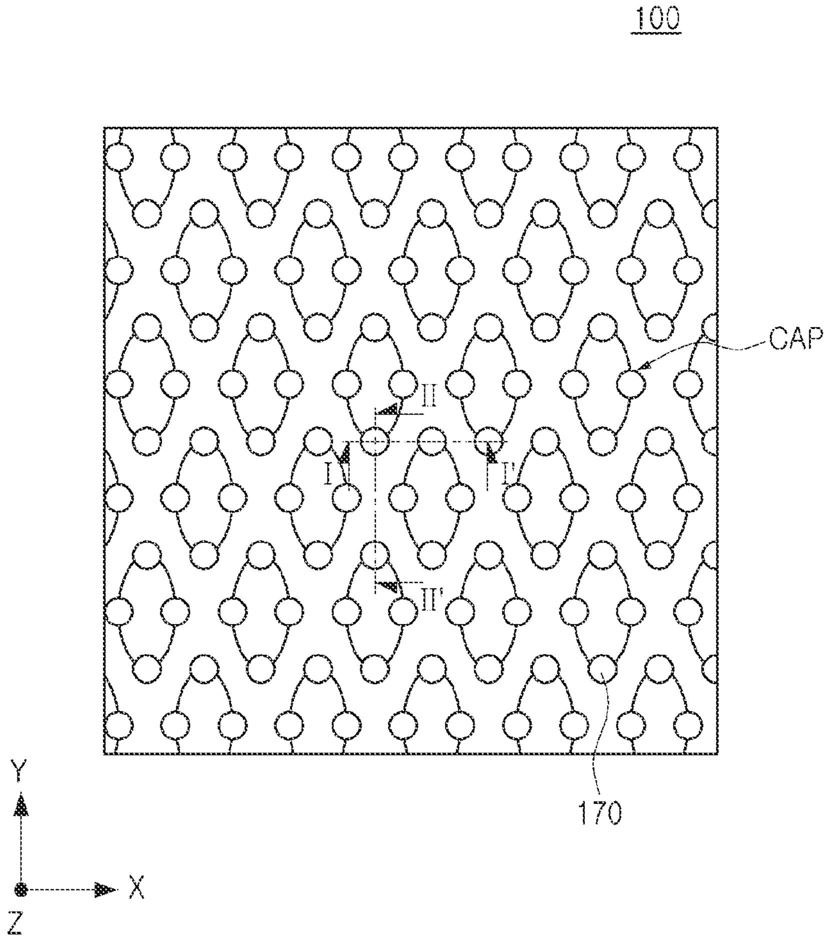
FIG. 1A is a schematic layout diagram illustrating a semiconductor device according to an example embodiment.
Figure 1B:
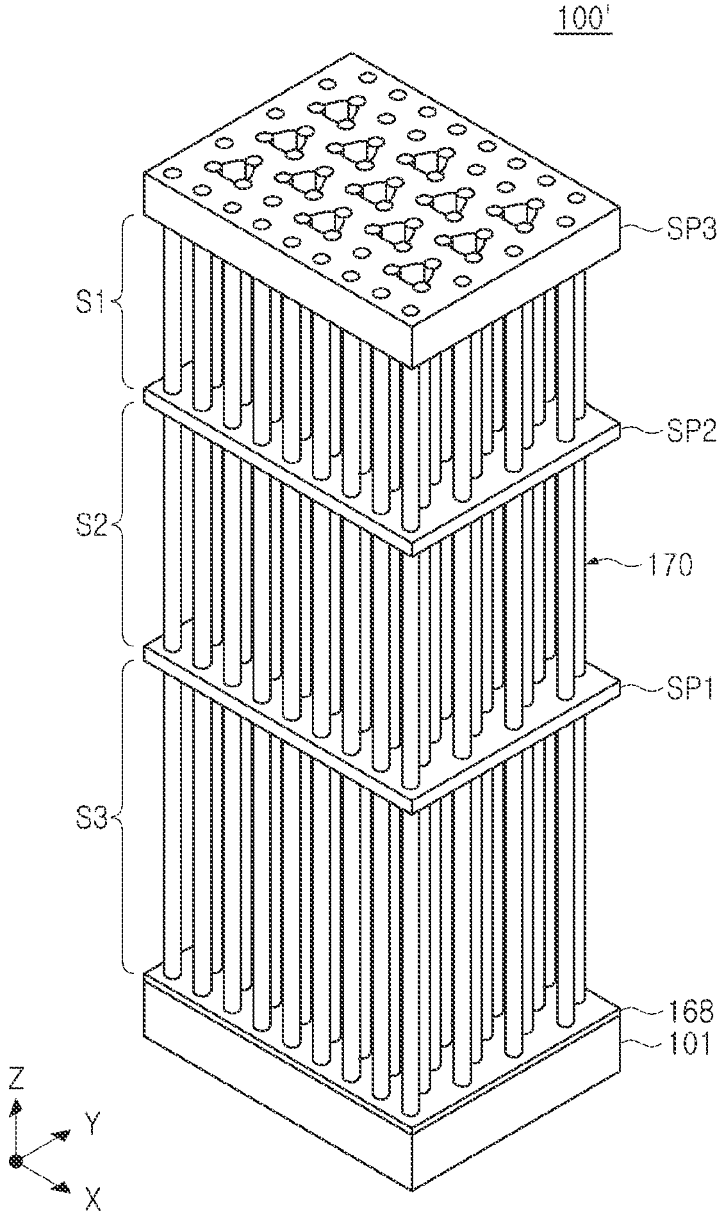
FIG. 1B is a schematic perspective view illustrating a semiconductor device according to an example embodiment.
Figure 1C:
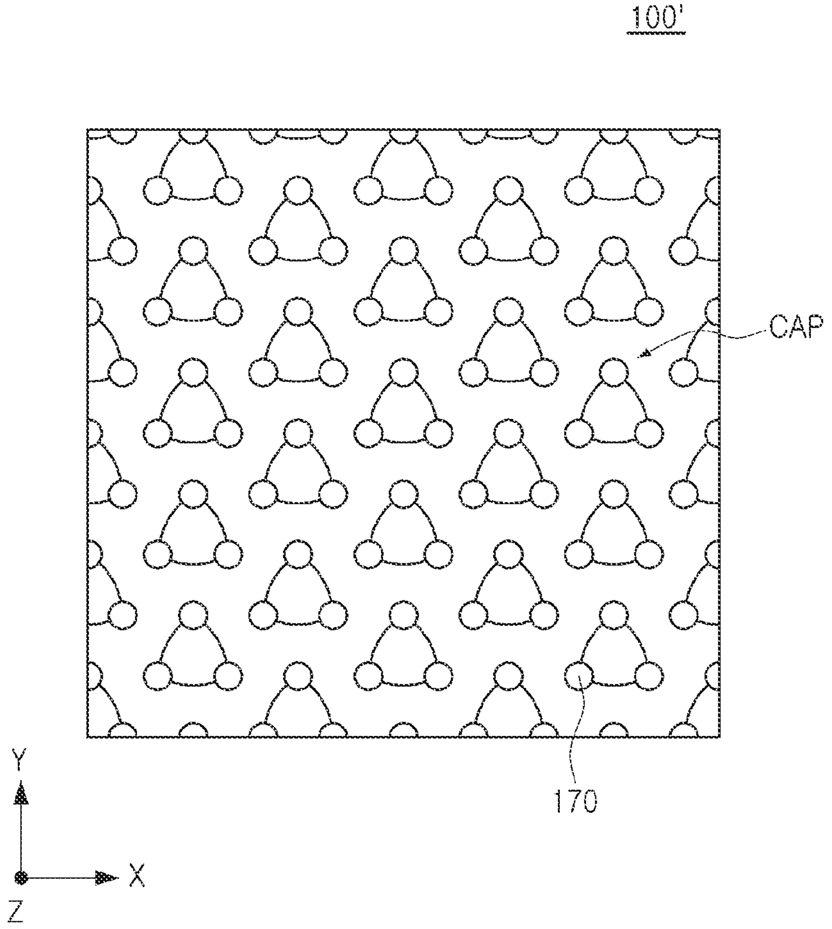
FIG. 1C is a schematic layout diagram illustrating a semiconductor device according to an example embodiment.

FIG. 1A is a layout diagram illustrating a semiconductor device 100 according to an example embodiment, FIG. 1B is a perspective view illustrating a semiconductor device 100' according to an example embodiment, and FIG. 1C is a layout diagram illustrating a semiconductor device 100' according to an example embodiment.

Figure 2:
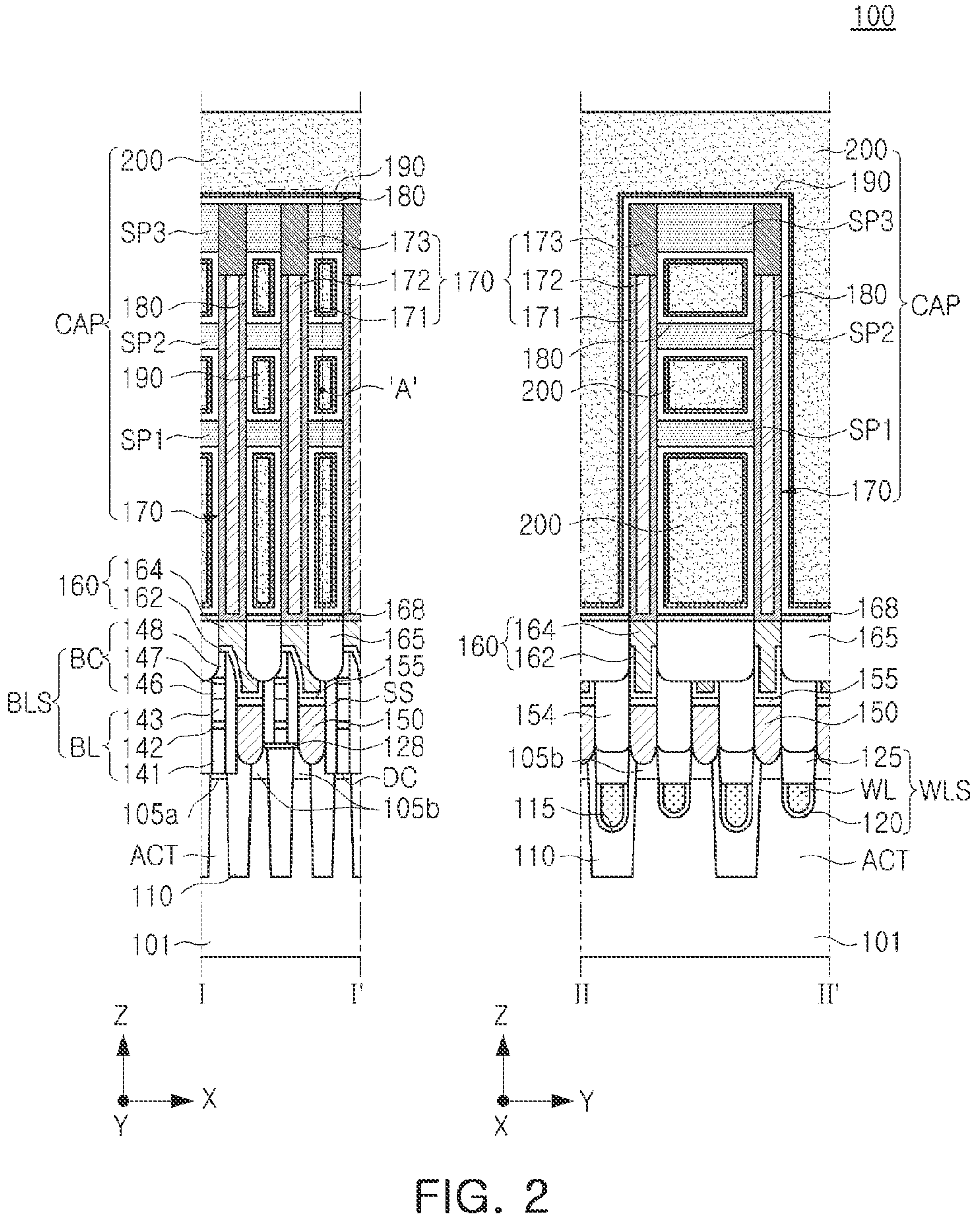
FIG. 2 is a schematic cross-sectional view illustrating a semiconductor device according to an example embodiment.

FIG. 2 is a cross-sectional view illustrating a semiconductor device 100 according to an example embodiment. FIG. 2 illustrates cross-sections of the semiconductor device 100 of FIG. 1A taken along cutting lines I-I' and II-II.'

Figure 3A:
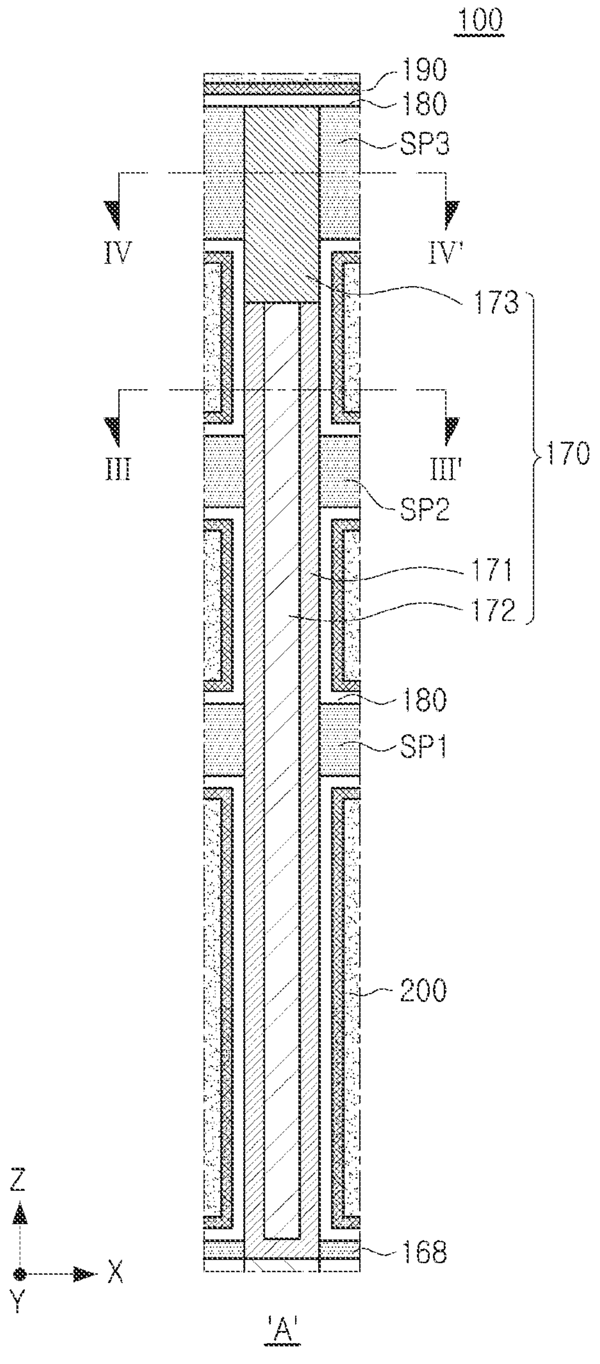
FIG. 3A is a schematic partially enlarged view of a semiconductor device according to an example embodiment.
Figure 3B:
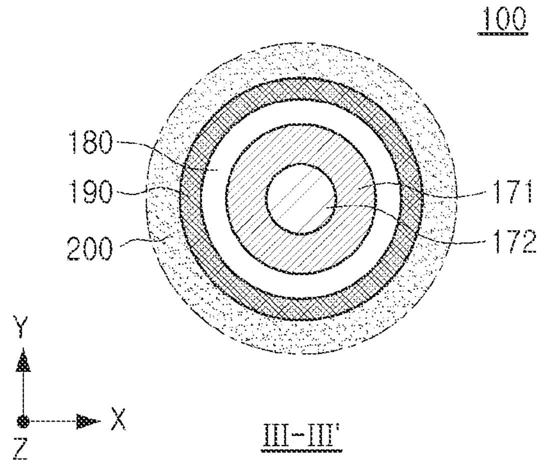
FIGS. 3B and 3C are schematic cross-sectional views illustrating the semiconductor device according to an example embodiment.
Figure 3C:
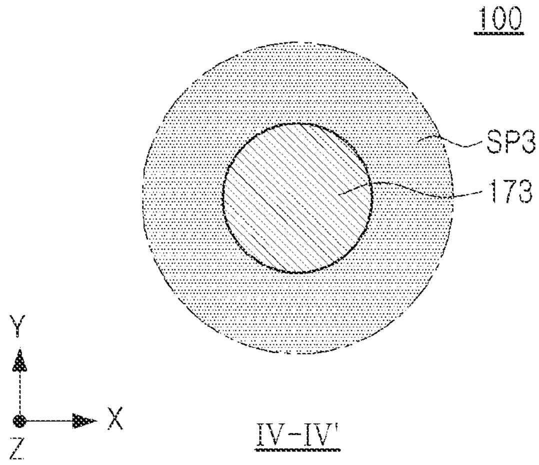

FIG. 3A is a partially enlarged view of a semiconductor device 100 according to an example embodiment, and FIGS. 3B and 3C are cross-sectional views of the semiconductor device 100 according to an example embodiment. FIGS. 3B and 3C illustrate cross-sections of the semiconductor device 100 of FIG. 3A along cutting lines III-III' and IV-IV', respectively. For convenience of description, only major components of the semiconductor device are illustrated in FIGS. 1A, 1B, 1C, 2, and 3A to 3C.

Referring to FIGS. 1A, 2 and 3A to 3C, the semiconductor device 100 may include a substrate 101 including active regions ACT, a device isolation layer 110 defining the active regions ACT in the substrate 101, a word line structure (WLS) buried in the substrate 101 and extended and including a word line (WL), a bit line structure (BLS) extending across the word line structure (WLS) on the substrate 101 and including a bit line (BL), and an information storage structure (CAP) disposed on the bit line structure (BLS). The information storage structure CAP may store information (e.g., bits of data). In an embodiment, the information storage structure CAP is a DRAM capacitor structure. The semiconductor device 100 may further include a lower conductive pattern 150 disposed on an active region ACT, an upper conductive pattern 160 disposed on a lower conductive pattern 150, and an insulating pattern 165 penetrating through the upper conductive pattern 160.

The semiconductor device 100 may include, for example, a dynamic random access memory (DRAM) cell array. For example, the bit line BL is connected to the first impurity region 105*a* of the active region ACT. In an embodiment, the second impurity region 105*b* of the active region ACT is electrically connected to the information storage structure CAP on the upper conductive pattern 160 through the lower and upper conductive patterns 150 and 160. The information storage structure (CAP) may include lower electrodes 170, a dielectric layer 180 disposed on the lower electrodes 170, an upper electrode 190 disposed on the dielectric layer 180, and a plate electrode 200 disposed on the upper electrode 190. Each of the lower electrodes 170 may include a first electrode layer 171, an insertion layer 172, and a second electrode layer 173. For example, the insertion layer 172 may be surrounded by the first electrode layer 171 and the second electrode layer 173. The information storage structure CAP may further include support layers SP1, SP2, and SP3.

The semiconductor device 100 may include a cell array area where a cell array is disposed and a peripheral circuit area where peripheral circuits for driving memory cells disposed in the cell array are disposed. The peripheral circuit area may be arranged around the cell array area. For example, the peripheral circuit area may surround the cell array area.

The substrate 101 may include a semiconductor material, such as a Group IV semiconductor, a Group III-V compound semiconductor, or a Group II-VI compound semiconductor. For example, the group IV semiconductor may include silicon, germanium, or silicon-germanium. The substrate 101 may further include impurities. The substrate 101 may be a silicon substrate, a silicon on insulator (SOI) substrate, a germanium substrate, a germanium on insulator (GOI) substrate, a silicon-germanium substrate, or a substrate including an epitaxial layer.

The active regions ACT may be defined within the substrate 101 by the device isolation layer 110. The active region ACT may have a bar shape and may be disposed in an island shape extending in one direction within the substrate 101. The one direction may be a direction inclined with respect to an extension portion direction of the word lines WL and bit lines BL. The active regions ACT may be arranged parallel to each other. An end of one active region ACT may be arranged adjacent to the center of another active region ACT adjacent thereto.

The active region ACT may have first and second impurity regions 105*a* and 105*b* located at a predetermined depth from an upper surface of the substrate 101. The first and second impurity regions 105*a* and 105*b* may be spaced apart from each other. The first and second impurity regions 105*a* and 105*b* may be provided as source/drain regions of a transistor formed by the word line WL. The source region and the drain region may be formed by first and second impurity regions 105*a* and 105*b* by doping or ion implantation of substantially the same impurities, and may be referred to interchangeably depending on the circuit configuration of the finally formed transistor, therein. The impurities of the source region and the drain region may include impurities having a conductivity type opposite to that of the substrate 101. In example embodiments, the depths of the first and second impurity regions 105*a* and 105*b* in the source region and the drain region are different from each other.

The device isolation layer 110 may be formed by a shallow trench isolation (STI) process. The device isolation layer 110 may electrically separate the active regions ACT from each other while surrounding the active regions ACT. The device isolation layer 110 may be formed of an insulating material, for example, silicon oxide, silicon nitride, or combinations thereof. The device isolation layer 110 may include a plurality of regions having different bottom depths according to the width of the trench in which the substrate 101 is etched.

The word line structures WLS may be disposed in the gate trenches 115 extending within the substrate 101. Each of the word line structures WLS may include a gate dielectric layer 120, a word line WL, and a gate capping layer 125. In this specification, the 'gate (120, WL)' may be referred to as a structure including the gate dielectric layer 120 and the word line (WL), the word line WL may be referred to as a 'gate electrode', and the word line structure (WLS) may be referred to as a 'gate structure.'

The word line WL may be disposed to extend in the first direction X across the active region ACT. For example, a pair of word lines WL adjacent to each other may be disposed to cross one active region ACT. The word line WL may constitute a gate of a buried channel array transistor (BCAT), but is not limited thereto. In an example embodiment, the word lines WL have a shape disposed on the substrate 101. The word line WL may be disposed below the gate trench 115 to a predetermined thickness. In an embodiment, an upper surface of the word line WL is positioned at a level lower than an upper surface of the substrate 101. In this specification, high and low of the term "level" may be defined based on a substantially flat upper surface of the substrate 101.

The word line WL may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern and an upper pattern formed of different materials. The lower pattern may include at least one of tungsten (W), titanium (Ti), tantalum (Ta), tungsten nitride (WN), titanium nitride (TiN), and tantalum nitride (TaN), and the upper pattern may be a semiconductor pattern including polysilicon doped with P-type or N-type impurities.

A gate dielectric layer 120 may be disposed on a bottom surface and inner side surfaces of the gate trench 115. The gate dielectric layer 120 may conformally or uniformly cover inner walls of the gate trench 115. The gate dielectric layer 120 may include at least one of silicon oxide, silicon nitride, and silicon oxynitride. The gate dielectric layer 120 may be, for example, a silicon oxide layer or an insulating layer having a high dielectric constant. In example embodiments, the gate dielectric layer 120 may be a layer formed by oxidizing the active region ACT or a layer formed by deposition.

The gate capping layer 125 may be disposed to fill the gate trench 115 above the word line WL. In an embodiment, an upper surface of the gate capping layer 125 is positioned at the same or substantially the same level as an upper surface of the substrate 101. The gate capping layer 125 may be formed of an insulating material such as silicon nitride.

The bit line structure BLS may extend in one direction perpendicular to the word line WL, for example, in the second direction Y. The bit line structure BLS may include a bit line BL and a bit line capping pattern BC disposed on the bit line BL.

The bit line BL may include a first conductive pattern 141, a second conductive pattern 142, and a third conductive pattern 143 sequentially stacked. For example, the second conductive pattern 142 may be formed on the first conductive pattern 141 and the third conductive pattern 143 may be formed on the second conductive pattern 142. The bit line capping pattern BC may be disposed on the third conductive pattern 143. A buffer insulating layer 128 may be disposed between the first conductive pattern 141 and the substrate 101. A portion of the first conductive pattern 141 (hereinafter referred to as a bit line contact pattern DC) may contact the first impurity region 105*a* of the active region ACT. The bit line BL may be electrically connected to the first impurity region 105*a* through the bit line contact pattern DC. In an embodiment, a lower surface of the bit line contact pattern DC is positioned at a level lower than the upper surface of the substrate 101, and is located at a level higher than the upper surface of the word line WL. In an example embodiment, the bit line contact pattern DC may be locally disposed in a bit line contact hole formed in the substrate 101 and exposing the first impurity region 105*a*.

The first conductive pattern 141 may include a semiconductor material such as polycrystalline silicon. The first conductive pattern 141 may directly contact the first impurity region 105*a*. The second conductive pattern 142 may include a metal-semiconductor compound. The metal-semiconductor compound may be, for example, a layer in which a part of the first conductive pattern 141 is silicidated. For example, the metal-semiconductor compound may include cobalt silicide (CoSi), titanium silicide (TiSi), nickel silicide (NiSi), tungsten silicide (WSi), or other metal silicides. The third conductive pattern 143 may include a metal material such as titanium (Ti), tantalum (Ta), tungsten (W), or aluminum (Al). The number of conductive patterns constituting the bit line BL, the type of material, and/or the stacking order may be variously changed according to embodiments.

The bit line capping pattern BC may include a first capping pattern 146, a second capping pattern 147, and a third capping pattern 148 sequentially stacked on the third conductive pattern 143. For example, the second capping pattern 147 may be formed on the first capping pattern 146, and the third capping pattern 148 may be formed on the second capping pattern 147. Each of the first to third capping patterns 146, 147, and 148 may include an insulating material, for example, a silicon nitride layer. The first to third capping patterns 146, 147, and 148 may be formed of different materials, and even if they include the same material, a boundary therebetween may be distinguishable due to differences in physical properties. In an embodiment, a thickness of the second capping pattern 147 is smaller than a thickness of the first capping pattern 146 and a thickness of the third capping pattern 148. The number of capping patterns constituting the bit line capping pattern BC and/or the type of material may be variously changed according to embodiments.

The spacer structures SS may be disposed on both sidewalls of each of the bit line structures BLS and extend in one direction, for example, the Y direction. The spacer structures SS may be disposed between the bit line structure BLS and the lower conductive pattern 150. The spacer structures SS may be disposed to extend along sidewalls of the bit line BL and sidewalls of the bit line capping pattern BC. A pair of spacer structures SS disposed on both sides of one bit line structure BLS may have an asymmetrical shape with respect to the bit line structure BLS. Each of the spacer structures SS may include a plurality of spacer layers, and may further include an air spacer according to embodiments. For example, a spacer structure SS may include an interior air gap as the air spacer.

The lower conductive pattern 150 may be connected to one region of the active region ACT, for example, the second impurity region 105*b*. The lower conductive pattern 150 may be disposed between the bit lines BL and between the word lines WL. The lower conductive pattern 150 may pass through the buffer insulating layer 128 and be connected to the second impurity region 105*b* of the active region ACT. The lower conductive pattern 150 may directly contact the second impurity region 105*b*. For example, a lower surface of the lower conductive pattern 150 may contact an upper surface of the second impurity region 105*b*. In an embodiment, the lower surface of the lower conductive pattern 150 is located at a lower level than the upper surface of the substrate 101 and is located at a higher level than the lower surface of the bit line contact pattern DC. The lower conductive pattern 150 may be insulated from the bit line contact pattern DC by the spacer structure SS. The lower conductive pattern 150 may be formed of a conductive material, for example, may include at least one of polycrystalline silicon (Si), titanium (Ti), titanium nitride (TiN), tantalum (Ta), tantalum nitride (TaN), tungsten (W), tungsten nitride (WN), and aluminum (Al). In an example embodiment, the lower conductive pattern 150 includes a plurality of layers.

A metal-semiconductor compound layer 155 may be disposed between the lower conductive pattern 150 and the upper conductive pattern 160. The metal-semiconductor compound layer 155 may be a layer formed as a portion of the lower conductive pattern 150 is silicided, for example, when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. According to an embodiment, the metal-semiconductor compound layer 155 is omitted. When the metal-semiconductor compound layer 155 is omitted, the upper conductive pattern 160 may contact the lower conductive pattern 155.

The upper conductive pattern 160 may be disposed on the lower conductive pattern 150. The upper conductive pattern 160 may extend between the spacer structures SS to cover the upper surface of the metal-semiconductor compound layer 155. The upper conductive pattern 160 may include a barrier layer 162 and a conductive layer 164. The barrier layer 162 may cover the lower end and side surfaces of the conductive layer 164. The barrier layer 162 may include at least one of a metal nitride, such as titanium nitride (TiN), tantalum nitride (TaN), and tungsten nitride (WN). The conductive layer 164 may include a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

The insulating patterns 165 may be disposed to pass through the upper conductive pattern 160. The upper conductive pattern 160 may be separated into a plurality of insulating patterns 165. The insulating patterns 165 may include an insulating material, for example, at least one of silicon oxide, silicon nitride, and silicon oxynitride.

An etch stop layer 168 may cover the insulating patterns 165 between the lower electrodes 170. For example, the etch stop layer 168 may contact an upper surface of the insulating patterns 150. The etch stop layer 168 may contact lower regions of side surfaces of the lower electrodes 170. The etch stop layer 168 may be disposed below the support layers SP1, SP2, and SP3. An upper surface of the etch stop layer 168 may include a portion directly contacting the dielectric layer 180. The etch stop layer 168 may include, for example, at least one of silicon nitride and silicon oxynitride.

The lower electrodes 170 may be disposed on the upper conductive patterns 160. The lower electrodes 170 may pass or penetrate through the etch stop layer 168 and contact the upper conductive patterns 160. The lower electrodes 170 may have a cylindrical shape, but are not limited thereto. The lower electrodes 170 may each include at least one of Niobium Nitride (NbN), Niobium Oxide (NbOx), Polycrystalline Silicon (Si), Iridium (Ir), Titanium (Ti), Titanium Nitride (TiN), Titanium Silicide Nitride (TiSiN), Tantalum (Ta), Tantalum Nitride (TaN)), tungsten (W), tungsten nitride (WN), and aluminum (Al), or combinations thereof, metal nitride, metal compound, or the like. Each of the lower electrodes 170 may include a first electrode layer 171, an insertion layer 172, and a second electrode layer 173.

The first electrode layer 171 may be disposed on the upper conductive patterns 160. The first electrode layer 171 may have a cylindrical shape. In an example embodiment, the first electrode layer 171 has a uniform or substantially uniform thickness.

The insertion layer 172 may be disposed on the first electrode layer 171. The insertion layer 172 may be disposed on the inner surface of the first electrode layer 171. The insertion layer 172 may be disposed between the first electrode layer 171 and the second electrode layer 173. The insertion layer 172 may be surrounded by the first electrode layer 171 and the second electrode layer 173.

The insertion layer 172 may be disposed between the first electrode layer 171 and the second electrode layer 173 and surrounded by the first electrode layer 171 and the second electrode layer 173. An outer surface of the insertion layer 172 may contact the first electrode layer 171, and an inner surface of the insertion layer 172 may contact the second electrode layer 173. An uppermost end of the insertion layer 172 may contact the second electrode layer 173. The insertion layer 172 may be surrounded by the first electrode layer 171 and the second electrode layer 173 in all directions. The insertion layer 172 may have a structure surrounded by the first electrode layer 171 and the second electrode layer 173. For example, the insertion layer 172 may be completely surrounded by the first electrode layer 171 and the second electrode layer 173. Due to this, the insertion layer 172 is spaced apart from the dielectric layer 180 by the first electrode layer 171 and the second electrode layer 173, and damage may be prevented. The first electrode layer 171 may cover the lower end of the insertion layer 172 and the sides of the insertion layer 172, and the second electrode layer 172 may cover the upper ends of the first electrode layer 171 and the insertion layer 172. In an example embodiment, the upper end of the insertion layer 172 is located at the same or substantially the same level as the upper end of the first electrode layer 171. However, the shape of the insertion layer 172 is not limited thereto. In an embodiment, the insertion layer 172 includes or is a material different from that of the first electrode layer 171 and the second electrode layer 173. Therefore, in the process of FIG. 6D described later, since a difference in selectivity between the first electrode layer 171 and the insertion layer 172 occurs, an upper end of the insertion layer 172 may be convex. In an embodiment, the insertion layer 172 is located at a higher level than the upper end of the first electrode layer 171. Conversely, the upper end of the insertion layer 172 may be concave and positioned at a lower level than the upper end of the first electrode layer 171.

The insertion layer 172 may include at least one of a metal, a metal nitride, and an oxide layer. The insertion layer 172 may include an insertion material containing a halogen element. The insertion material of the insertion layer 172 may further include at least one of a conductive material and a dielectric material. The conductive material of the insertion layer 172 may include at least one of W, Ta, Sn, WN, TaN, and SnN, and the dielectric material of the insertion layer 172 may include silicon oxide. In an embodiment, the metal, the metal nitride, and/or the oxide film include fluorine (F), which is a halogen element.

The second electrode layer 173 is disposed on the insertion layer 172 and may cover the upper surface of the first electrode layer 171 and the upper surface of the insertion layer 172. The lower surface of the second electrode layer 173 may contact the upper surface of the first electrode layer 171 and the upper surface of the insertion layer 172. In an embodiment, an upper surface of the second electrode layer 173 is positioned at a level higher than the upper surface of the first electrode layer 171 and the upper surface of the insertion layer 172. The outer side surface of the second electrode layer 173 may include a portion vertically aligned with the outer side surface of the first electrode layer 171. In an example embodiment, the first electrode layer 171 and the second electrode layer 173 include or are a conductive material. For example, the conductive material may include at least one or a combination of polycrystalline silicon (Si), TiN, NbN, WN, VN, MoN, TaN, TiSiN and TiCN. The first electrode layer 171 and the second electrode layer 173 may include the same or different materials.

According to an example embodiment, the first electrode layer 171 includes a halogen element in a first concentration. In an embodiment, the insertion layer 172 includes a halogen element in a second concentration higher than the first concentration. In an embodiment, the dielectric layer 180 include a halogen element at a third concentration higher than the first concentration. For example, the concentration of the halogen element included in the insertion layer 172 and the dielectric layer 180 may be higher than the concentration of the halogen element included in the first electrode layer 171. In an embodiment, the concentration of fluorine (F) included in the insertion layer 172 and the dielectric layer 180 is higher than the concentration of fluorine (F) included in the first electrode layer 171. The insertion layer 172 and the dielectric layer 180 may contain fluorine (F). Thus, it may be determined whether the insertion layer 172 and the dielectric layer 180 contain fluorine (F) through component analysis such as transmission electron microscopy energy-dispersive X-ray spectroscopy (TEM-EDX). In addition, by Time-of-Flight Secondary Ion Mass Spectrometry (ToF-SIMS), concentrations of fluorine (F) included in the first electrode layer 171, the insertion layer 172, and the dielectric layer 180 may be compared.

As illustrated in FIG. 3B, at the level of the cutting line III-III' in FIG. 3A, the information storage structure may be formed of the insertion layer 172, the first electrode layer 171 surrounding the outer side surface of the insertion layer 172, a dielectric layer 180 surrounding the outer side surface of the first electrode layer 171, and an upper electrode 190 surrounding the outer side surface of the dielectric layer 180. As illustrated in FIG. 3C, at the level of the cut line IV-IV' of FIG. 3A, the third support layer SP3 may surround the outer side surface of the second electrode layer 173. When the first electrode layer 171 and the insertion layer 172 have different material compositions, boundaries thereof may be distinguished through analysis such as Transmission Electron Microscopy Energy-Dispersive X-ray spectroscopy (TEM-EDX), and it may be determined whether the first electrode layer 171 has a structure completely surrounding the outer side surface of the insertion layer 172.

At least one or more support layers SP1, SP2, and SP3 supporting the lower electrodes 170 may be provided between adjacent lower electrodes 170. For example, a first support layer SP1, a second support layer SP2, and a third support layer SP3 contacting the lower electrodes 170 may be provided between adjacent lower electrodes 170. The second support layer SP2 is located between the first support layer SP1 and the third support layer SP3.

Referring to FIG. 1A, in a plan view viewed from above, the lower electrodes 170 may have a regular arrangement. In example embodiments, the lower electrodes 170 may be spaced apart from each other by a predetermined distance along the first direction (X), and may be arranged in a zigzag pattern along the second direction (Y). However, the arrangement of the lower electrodes 170 is not limited thereto.

A through-hole pattern may be disposed between the plurality of adjacent lower electrodes 170. In example embodiments, as illustrated in the semiconductor device 100 of FIG. 1A, one through-hole pattern may be disposed between four adjacent lower electrodes 170. However, the through-hole pattern is not limited thereto. In other embodiments, as in the semiconductor device 100' illustrated in FIGS. 1B and 1C, one through-hole pattern may be disposed between three adjacent lower electrodes 170.

The support layers SP1, SP2, and SP3 may include a first support layer SP1, a second support layer SP2 disposed on the first support layer SP1, and a third support layer SP3 disposed on the second support layer SP2. The third support layer SP3 may be the uppermost support layer SP3, and the second support layer SP2 may be a next higher support layer SP2 disposed at a lower level than the uppermost support layer SP3. The upper surface of the first electrode layer 171 and the upper surface of the insertion layer 172 may be positioned at a level between the lower surface of the uppermost support layer SP3 and the upper surface of the next higher support layer SP2, but are not limited thereto. The first support layer SP1 and the second support layer SP2 may be referred to as lower support layers SP1 and SP2, and the third support layer SP3 may be referred to as an upper support layer SP3. According to an example embodiment, the lower support layers SP1 and SP2 contact the first electrode layer 171 and are spaced apart from the insertion layer 172, and the upper support layer SP3 contacts the second electrode layer 173, but is not limited thereto. According to an embodiment, the first support layer SP1 contacts the first electrode layer 171, and the second support layer SP2 and the third support layer SP3 contact the second electrode layer 173. The support layers SP1, SP2, and SP3 may be spaced apart from the substrate 101 in a direction perpendicular to the upper surface of the substrate 101. The support layers SP1, SP2, and SP3 contact the lower electrodes 170 and may extend in a direction parallel to the upper surface of the substrate 101.

The first support layer SP1 and the second support layer SP2 may contact the first electrode layer 171 and may be spaced apart from the second electrode layer 173. For example, the first support layer SP1 and the second support layer SP2 may contact a side surface of the first electrode layer 171. The third support layer SP3 may contact the second electrode layer 173. For example, the third support layer SP3 may contact a side surface of the second electrode layer 173. The support layers SP1, SP2, and SP3 may include portions directly contacting the lower electrodes 170 and the dielectric layer 180. The third support layer SP3 may have a thickness greater than that of the first support layer SP1 and the second support layer SP2, but is not limited thereto. The support layers SP1, SP2, and SP3 may be layers supporting the lower electrodes 170 having a high aspect ratio. Each of the support layers SP1, SP2, and SP3 may include, for example, at least one of silicon nitride and silicon oxynitride, or a material similar thereto. The number, thickness, and/or arrangement relationship of the support layers SP1, SP2, and SP3 is not limited to that illustrated, and may be variously changed according to embodiments.

The dielectric layer 180 may cover the lower electrodes 170 on surfaces of the lower electrodes 170. The dielectric layer 180 may be disposed between the lower electrodes 170 and the upper electrode 190. In an embodiment, the dielectric layer 180 covers upper and lower surfaces of the support layers SP1, SP2, and SP3. The dielectric layer 180 may cover the upper surface of the etch stop layer 168.

The dielectric layer 180 may include a high-k material, silicon oxide, silicon nitride, or combinations thereof. However, according to embodiments, the dielectric layer 180 may include titanium (Ti) doped with fluorine (F), tantalum (Ta), hafnium (Hf), aluminum (Al), zirconium (Zr), and lanthanum (La) may include oxides, nitrides, silicides, oxynitrides, or silicified oxynitrides including at least one or combinations thereof. For example, since the lower electrodes 170 include an insertion layer 172 containing fluorine (F), fluorine (F) may diffuse from the insertion layer 172 to the dielectric layer 180 through a heat treatment process. For example, the lower electrodes 170 may be heated until a sufficient amount of fluorine diffuses into the dielectric layer 180. Therefore, defects due to leakage current of the dielectric layer 180 may be reduced and the semiconductor device 100 with increased electrical characteristics may be provided.

The upper electrode 190 may cover the plurality of lower electrodes 170, the support layers SP1, SP2, and SP3, and the dielectric layer 180. The upper electrode 190 may extend along the surface of the dielectric layer 180. In an embodiment, the upper electrode 190 directly contacts the dielectric layer 180.

While the upper electrode 190 is illustrated in FIG. 2 as a single electrode layer, it is not limited thereto. In other embodiments, the upper electrode 190 may include a plurality of electrode layers. The upper electrode 190 may include or be a conductive material. The upper electrode 190 may include at least one of, for example, polycrystalline silicon (Si), TiN, NbN, WN, VN, MoN, TaN, TiSiN, and TiCN, or combinations thereof, a metal nitride, a metal compounds, or the like.

The plate electrode 200 may be disposed on the upper electrode 190. In an embodiment, the plate electrode 200 directly contacts upper and side surfaces of the upper electrode 190. The plate electrode 200 may fill a space between the plurality of lower electrodes 170 and a space between the support layers SP1, SP2, and SP3. The plate electrode 200 may include a conductive material. For example, the plate electrode 200 may include a silicon material or a silicon-germanium material. For example, the plate electrode 200 may include a doped silicon material or a doped silicon-germanium material.

Referring to FIGS. 4A to 4C and 5A to 5C, semiconductor devices according to example embodiments will be described. The semiconductor devices illustrated in FIGS. 4A to 4C and 5A to 5C are different from the previous embodiment of FIGS. 1A to 3C in the structure of the lower electrodes.

In the example embodiments of FIGS. 4A to 4C and 5A to 5C, features described with the same reference numerals as described above may be the same or similar. In the description of the following embodiments, the overlapping content with the above-described FIGS. 1A to 3C will be omitted.

Figure 4A:
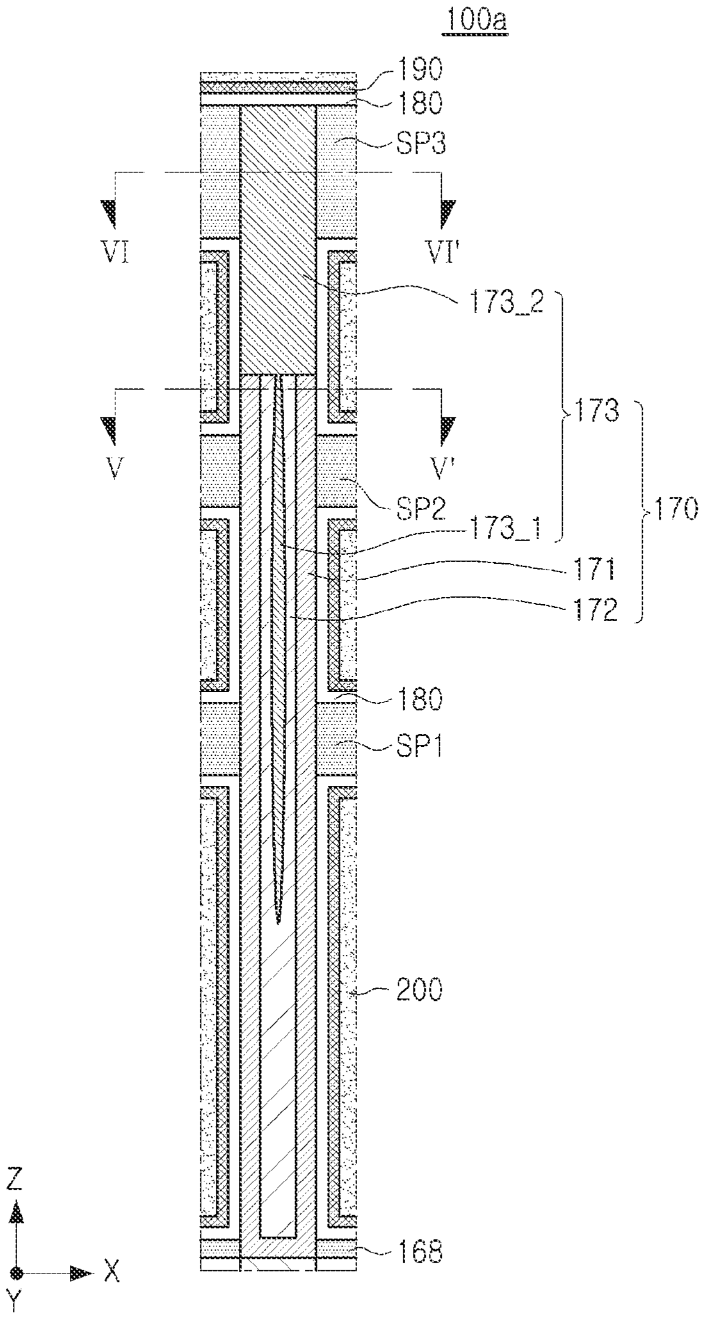
FIG. 4A is a schematic partially enlarged view illustrating a semiconductor device according to an example embodiment.
Figure 4B:
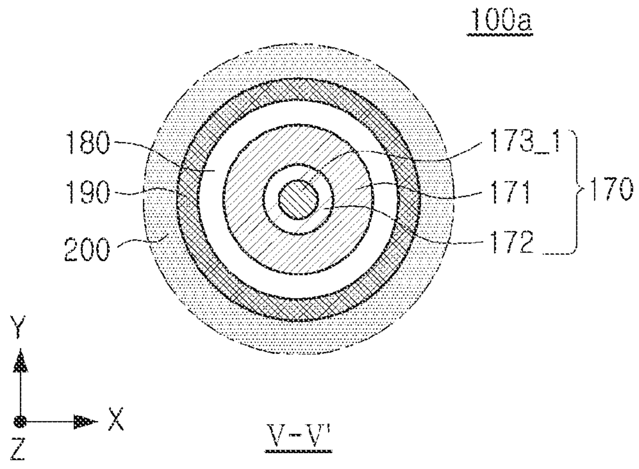
FIGS. 4B and 4C are schematic cross-sectional views illustrating the semiconductor device according to an example embodiment.
Figure 4C:
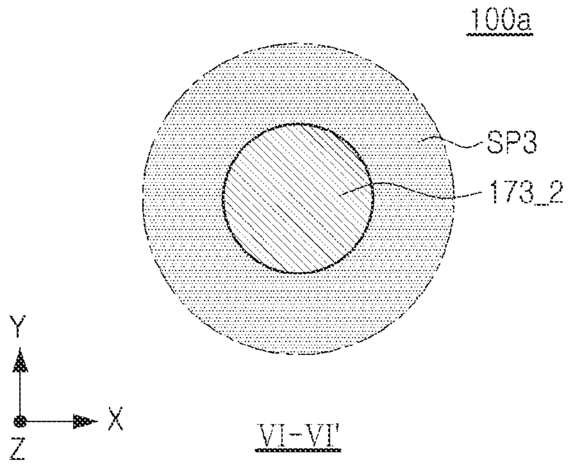

FIG. 4A is a partially enlarged view illustrating an enlarged portion of an information storage structure of a semiconductor device according to an example embodiment, and FIGS. 4B and 4C are cross-sectional views illustrating information storage structures of the semiconductor device 100*a* according to an example embodiment. For example, the semiconductor device 100 of FIG. 3A may be replaced with the semiconductor device 100*a*. FIG. 4A illustrates an area corresponding to the 'A' area in FIG. 2, and FIGS. 4B and 4C illustrate cross-sections taken along the cutting lines V-V' and VI-VI' in FIG. 4A.

Referring to FIGS. 4A to 4C, the lower electrodes 170 may have a cylindrical shape. The insertion layer 172 may have a cylindrical shape. An outer surface of the insertion layer 172 may contact an inner surface of the first electrode layer 171, and an inner surface of the insertion layer 172 may contact an outer surface of the first portion 173_1 of the second electrode layer 173. In an embodiment, a part of the upper surface of the insertion layer 172 is positioned at a lower level than the upper surface of the first electrode layer 171.

In this specification, the 'first part 173_1' and the 'second part 173_2' may be referred to as an 'extension portion part' and a 'pillar portion', respectively.

The insertion layer 172 has an outer side surface in contact with the first electrode layer 171 and an inner side surface defining an internal space. The second electrode layer 173 may include an extension portion 173_1 disposed in the internal space and contacting the inner side surface of the insertion layer 172, and a pillar portion 173_2 extending from the extension portion part 173_1 and contacting the upper end of the insertion layer 172 and the upper end of the first electrode layer 171.

The insertion layer 172 may have a cylindrical shape. The second electrode layer 173 may have a T-shape completely filling an internal space defined by the insertion layer 172. For example, the first electrode layer 171 contacts the outer side surface of the insertion layer 172, and the second electrode layer 173 contacts the inner side surface of the insertion layer 172 and may extend to cover the upper end of the insertion layer 172. In an embodiment, the insertion layer 172 covers a lower end of the extension portion 173_1 of the second electrode layer 173 and surrounds a side surface of the extension portion 173_1 of the second electrode layer 173.

The second electrode layer 173 may fill the internal space formed by the insertion layer 172, and may extend to cover the upper end of the first electrode layer 171 and the upper end of the insertion layer 172. The second electrode layer 173 may include an extension portion 173_1 extending into the insertion layer 172 and a pillar portion 173_2 covering the upper end of the first electrode layer 171 and the upper end of the insertion layer 172. For example, the extension portion 173_1 may penetrate the insertion layer 172. The extension portion part 173_1 of the second electrode layer 173 may extend from the pillar portion 173_2 of the second electrode layer 173. The first portion 173_1 may contact the inner side surface of the insertion layer 172 and may have a pillar shape. The second part 173_2 extends from the first part 173_1 and may have a pillar shape covering the upper end of the first electrode layer 171 and the upper end of the insertion layer 172. In an embodiment, the second portion 173_2 has a greater width than the first portion 173_1. The side surface of the second part 173_2 may include a part vertically aligned with the side surface of the first electrode layer 171.

The third support layer SP3 may contact the second part 173_2 of the second electrode layer 173. For example, the third support layer SP3 may contact a side surface of the second part 173_2.

Referring to FIG. 4B, at the level of the cut line V-V' in FIG. 4A, the information storage structure may include the lower electrode 170 having a first part 173_1, the insertion layer 172 surrounding the outer side surface of the first part 173_1, the first electrode layer 171 surrounding the outer side surface of the insertion layer 172, a dielectric layer 180 surrounding the outer side surface of the first electrode layer 171, and an upper electrode 190 surrounding the outer side surface of the dielectric layer 180. Referring to FIG. 4C, at the level of the cut line VI-VI' of FIG. 4A, the lower electrode 170 may be configured to include a second part 173_2. The third support layer SP3 may surround the second portion 173_2 of the lower electrode 170.

Figure 5A:
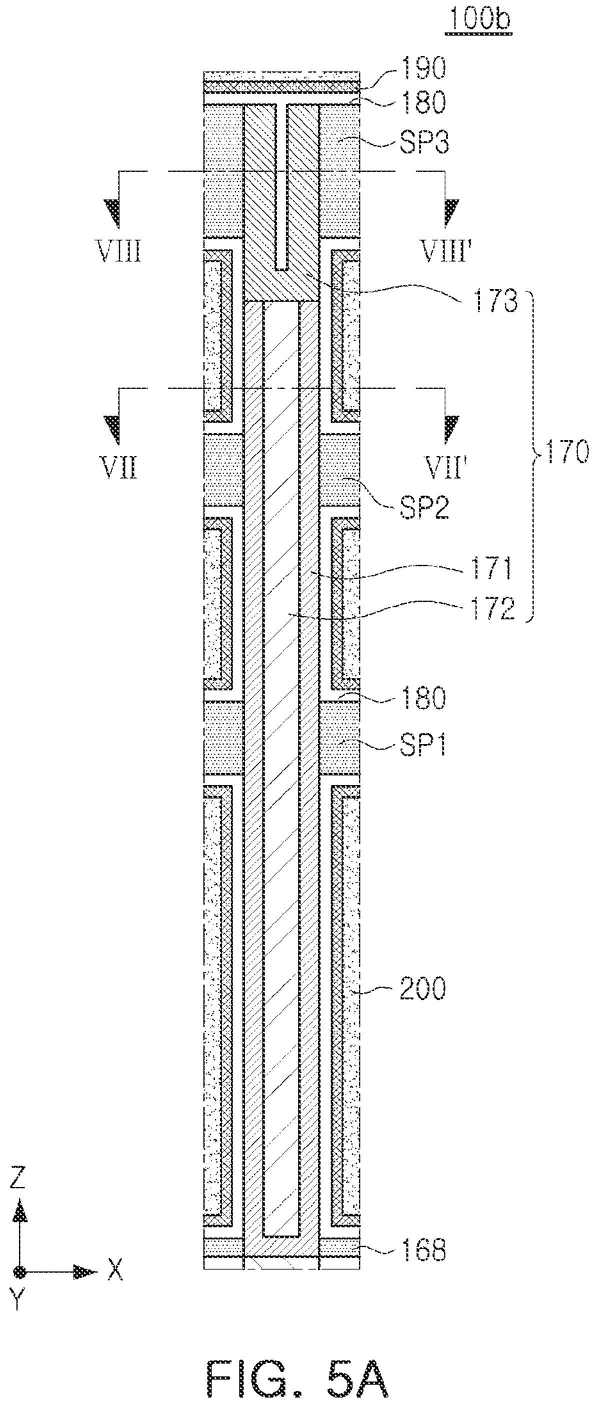
FIG. 5A is a schematic partially enlarged view illustrating a semiconductor device according to an example embodiment.
Figure 5B:
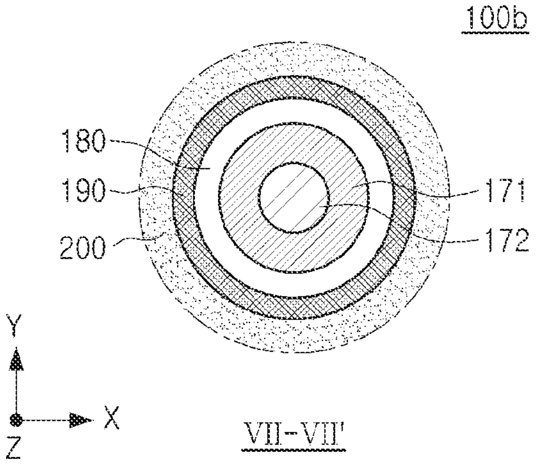
FIGS. 5B and 5C are schematic cross-sectional views illustrating the semiconductor device according to an example embodiment.
Figure 5C:
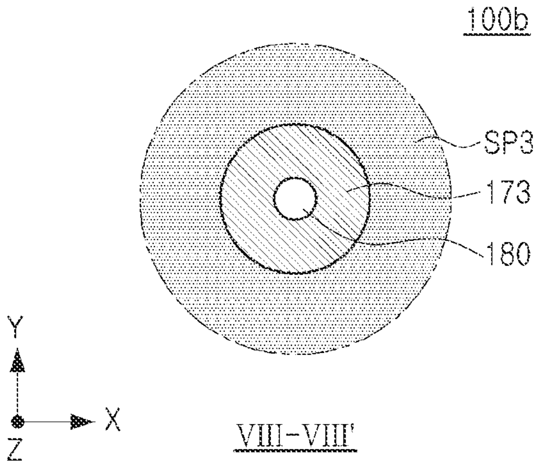

FIG. 5A is a partially enlarged view illustrating an enlarged portion of an information storage structure of a semiconductor device according to an example embodiment, and FIGS. 5B and 5C are cross-sectional views illustrating information storage structures of the semiconductor device 100*b* according to an example embodiment. The semiconductor device 100 of FIG. 3A may be replaced by the semiconductor device 100*b*. FIG. 5A illustrates an area corresponding to the 'A' area in FIG. 2, and FIGS. 5B and 5C illustrate cross-sections taken along cutting lines VII-VII' and VIII-VIII' in FIG. 5A.

Referring to FIGS. 5A to 5C, the lower electrodes 170 may have a cylindrical shape.

Each of the lower electrodes 170 may include a first electrode layer 171, an insertion layer 172, and a second electrode layer 173. The first electrode layer 171 may have a cylindrical shape. The insertion layer 172 has a pillar shape and may be disposed on the inner side surface of the first electrode layer 171. The second electrode layer 173 may be disposed on the upper surface of the first electrode layer 171 and the upper surface of the insertion layer 172. The second electrode layer 173 may cover the upper surface of the first electrode layer 171 and the upper surface of the insertion layer 172.

The dielectric layer 180 may cover the second electrode layer 173. For example, the dielectric layer 180 may contact an upper surface of the second electrode layer 173. The dielectric layer 180 may contact the inner side surface of the second electrode layer 173 and the upper surface of the second electrode layer 173, respectively. The dielectric layer 180 may include a portion filling an internal space defined by the second electrode layer 173. A portion of the dielectric layer 180 filling the internal space defined by the second electrode layer 173 may have a pillar shape.

Referring to FIG. 5B, at the level of the cut line VII-VII' in FIG. 5A, the information storage structure may include an insertion layer 172, the first electrode layer 171 surrounding the outer surface of the insertion layer 172, a dielectric layer 180 surrounding the outer surface of the first electrode layer 171, and an upper electrode 190 surrounding the outer surface of the dielectric layer 180. Referring to FIG. 5C, at the level of the cutting line VIII-VIII' of FIG. 5A, the information storage structure may include the dielectric layer 180, the second electrode layer 173 surrounding the outer surface of the dielectric layer 180, and the third support layer SP3 surrounding the outer surface of the second electrode layer 173.

FIGS. 6A to 6F are cross-sectional views illustrating a method of manufacturing a semiconductor device according to an example embodiment. FIGS. 6A to 6F explain an example embodiment of a manufacturing method for manufacturing the semiconductor device of FIG. 3A, and illustrate cross-sections corresponding to I-I' and II-II' of FIG. 2.

Figure 6A:
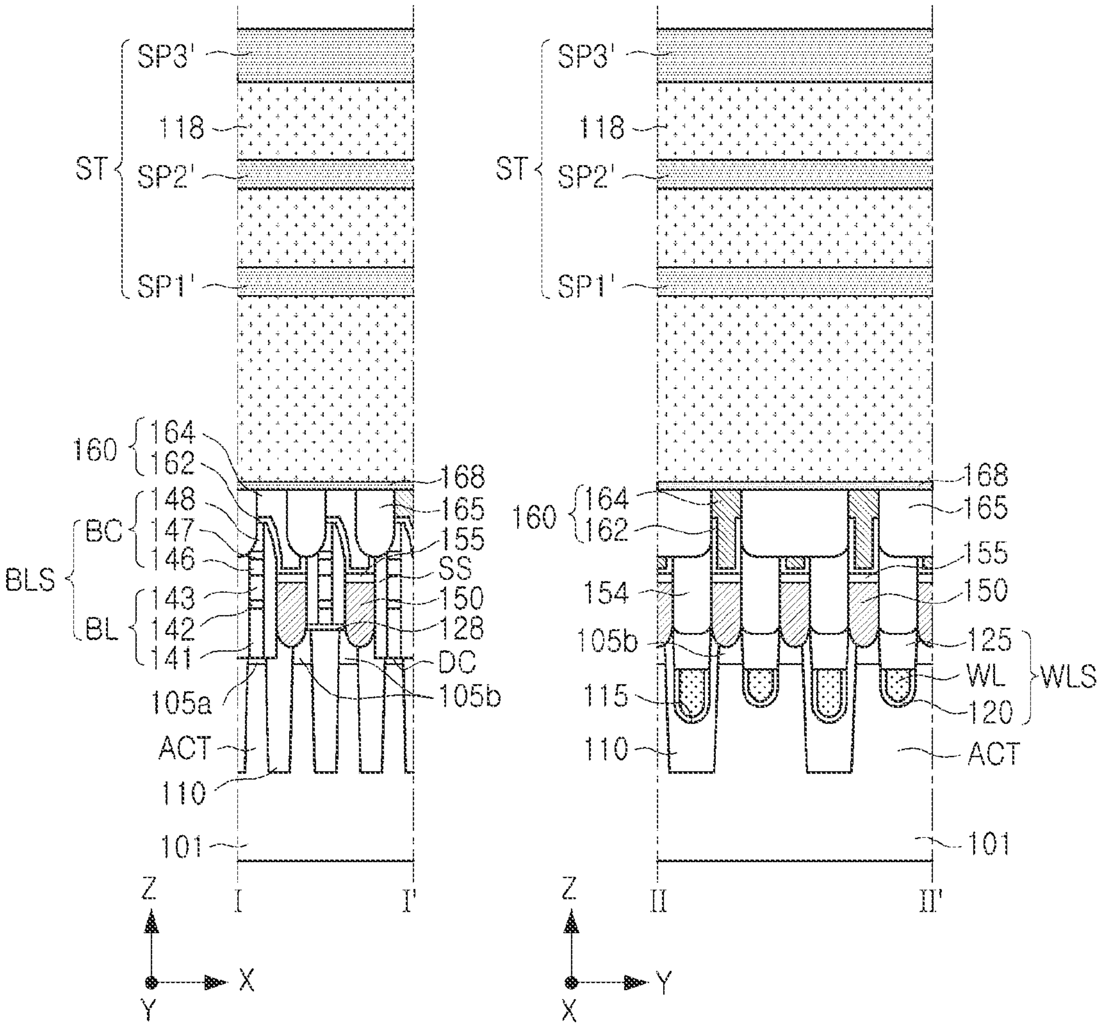
FIGS. 6A, 6B, 6C, 6D, 6E and 6F are schematic cross-sectional views illustrating a method of manufacturing a semiconductor device according to an example embodiment.

Referring to FIG. 6A, the active region ACT may be defined by forming the device isolation layer 110 on the substrate 101. A device isolation trench may be formed in the substrate 101, and the device isolation layer 110 may fill the device isolation trench. In a plan view, the active region ACT may have an elongated bar shape extending in a direction oblique to the extension portion direction of the word line WL. An ion implantation process may be performed using the device isolation layer 110 as an ion implantation mask to form impurity regions on the active region ACT. The gate trench 115 may be formed by patterning the active region ACT and the isolation layer 110. A pair of gate trenches 115 may cross the active region ACT, but is not limited thereto. The impurity regions may also be separated by the gate trench 115 to form a first impurity region 105*a* and a second impurity region 105*b*.

The gate dielectric layer 120 may be formed on the inner surface of the gate trench 115 to a substantially conformal or uniform thickness. Next, the word line WL may be formed to fill at least a portion of the gate trench 115. In an embodiment, an upper surface of the word line WL is recessed lower than an upper surface of the active region ACT. For example, the upper surface of the active region ACT may be lower than the upper surface of the active region ACT. An insulating layer may be stacked on the substrate 101 to fill the gate trench 115 and then etched to form a gate capping layer 125 on the word line WL.

An insulating layer and a conductive layer may be sequentially formed on the entire surface of the substrate 101 and then patterned to form the sequentially stacked buffer insulating layer 128 and the first conductive pattern 141. The buffer insulating layer 128 may be formed of at least one of silicon oxide, silicon nitride, and silicon oxynitride. A plurality of buffer insulating layers 128 may be formed to be spaced apart from each other. The first conductive pattern 141 may have a shape corresponding to the planar shape of the buffer insulating layer 128. The buffer insulating layer 128 may be formed to simultaneously cover ends of the two adjacent active regions ACT, for example, the adjacent second impurity regions 105*b*. By using the buffer insulating layer 128 and the first conductive pattern 141 as an etching mask, upper portions of the device isolation layer 110, the substrate 101, and the gate capping layer 125 may be etched to form a bit line contact hole. The bit line contact hole may expose the first impurity region 105*a*.

A bit line contact pattern DC filling the bit line contact hole may be formed. Forming the bit line contact pattern DC may include forming a conductive layer filling the bit line contact hole and performing a planarization process. For example, the bit line contact pattern DC may be formed to include polysilicon. After sequentially forming the second conductive pattern 142, the third conductive pattern 143, and the first to third capping patterns 146, 147, and 148 on the first conductive pattern 141, the first to third conductive patterns 141, 142, and 143 may be sequentially etched using the first to third capping patterns 146, 147, and 148 as an etch mask. As a result, a bit line structure (BLS) including the bit line BL including the first to third conductive patterns 141, 142, and 143 and the bit line capping pattern BC including the first to third capping patterns 146, 147, and 147 may be formed.

Spacer structures SS may be formed on side surfaces of the bit line structure BLS. For example, the spacer structures may be formed to contact the side surfaces of the bit line structure BLS. The spacer structure SS may be formed to include a plurality of layers. Fence insulation patterns 154 may be formed between the spacer structures SS. The fence insulation patterns 154 may include silicon nitride or silicon oxynitride. An anisotropic etching process may be performed using the fence insulation patterns 154 and the third capping pattern 148 as an etch mask to form an opening exposing the second impurity region 105*b*.

A lower conductive pattern 150 may be formed below the opening. The lower conductive pattern 150 may be formed of a semiconductor material such as polysilicon. For example, the lower conductive pattern 150 may be formed by forming a polysilicon layer filling the opening and then performing an etch-back process.

A metal-semiconductor compound layer 155 may be formed on the lower conductive pattern 150. Formation of the metal-semiconductor compound layer 155 may include a metal layer deposition process and a heat treatment process.

An upper conductive pattern 160 may be formed above the opening. Forming of the upper conductive pattern 160 may include sequentially forming the barrier layer 162 and the conductive layer 164. For example, the barrier layer 162 may be formed on the metal-semiconductor compound layer 155 and the conductive layer 164 may be formed on the barrier layer 162. Thereafter, a patterning process may be performed on the barrier layer 162 and the conductive layer 164 to form insulating patterns 165 penetrating the barrier layer 162 and the conductive layer 164. Accordingly, lower structures including the substrate 101, the word line structure WLS, and the bit line structure BLS may be formed.

An etch stop layer 168 may be conformally or uniformly formed on the lower structure, and mold layers 118 and preliminary support layers SP1', SP2', and SP3' may be alternately stacked on the etch stop layer 168. The mold layers 118 and the preliminary support layers SP1', SP2', and SP3' may form the laminated structure ST. The etch stop layer 168 may include an insulating material having etch selectivity with respect to mold layers 118 under specific etching conditions, for example, at least one of silicon oxide, silicon nitride, silicon carbide, silicon oxycarbide, and silicon carbonitride. The mold layers 118 may be formed of silicon oxide, and the preliminary support layers SP1', SP2', and SP3' may be formed of silicon nitride. For example, a first one of the mold layers 118 may be formed between the etch stop layer 168 and the first preliminary support layer SP1', a second one of the mold layers 118 may be formed between the first preliminary support layer SP1' and the second preliminary support layer SP2', and a third one of the mold layers 118 may be formed between the second preliminary support layer SP2' and the third preliminary support layer SP3'.

Figure 6B:
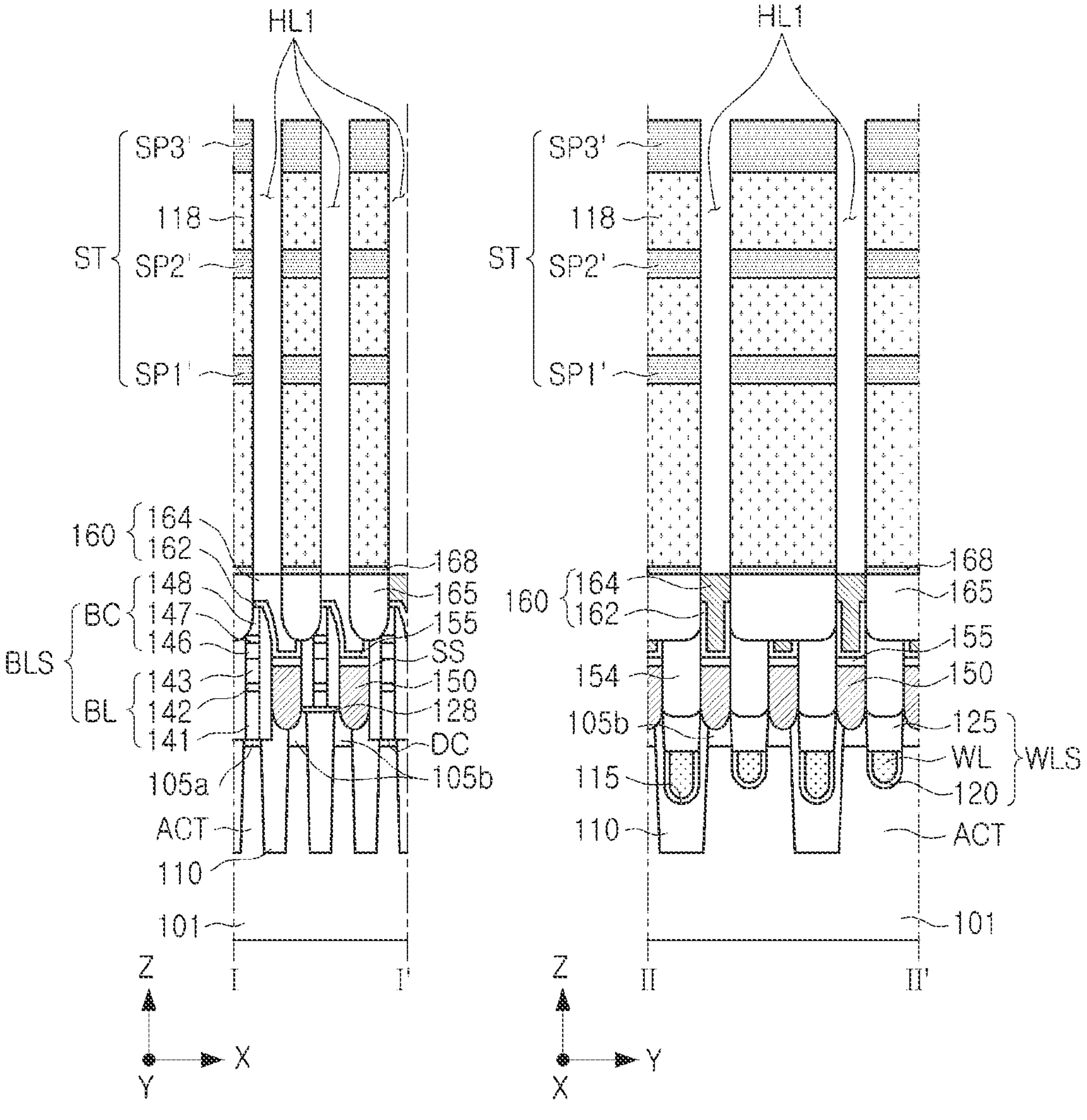

Referring to FIG. 6B, a plurality of holes HL1 penetrating the mold layers 118 and the preliminary support layers SP1', SP2', and SP3' may be formed. For example, portions of the mold layers 118 and the preliminary support layers SP1', SP2', and SP3' may be removed to form the plurality of holes HL1. In the step of forming the plurality of holes HL1, the etch stop layer 168 may serve as a stopper to stop the progress of the etching process. The plurality of holes HL1 may pass through the etch stop layer 168 to expose the upper conductive patterns 160. The plurality of holes HL1 are regions in which the lower electrodes 170 are to be formed, and may be formed in a regular arrangement by being spaced apart at predetermined intervals on a plane, as illustrated in FIGS. 1A to 1C.

Figure 6C:
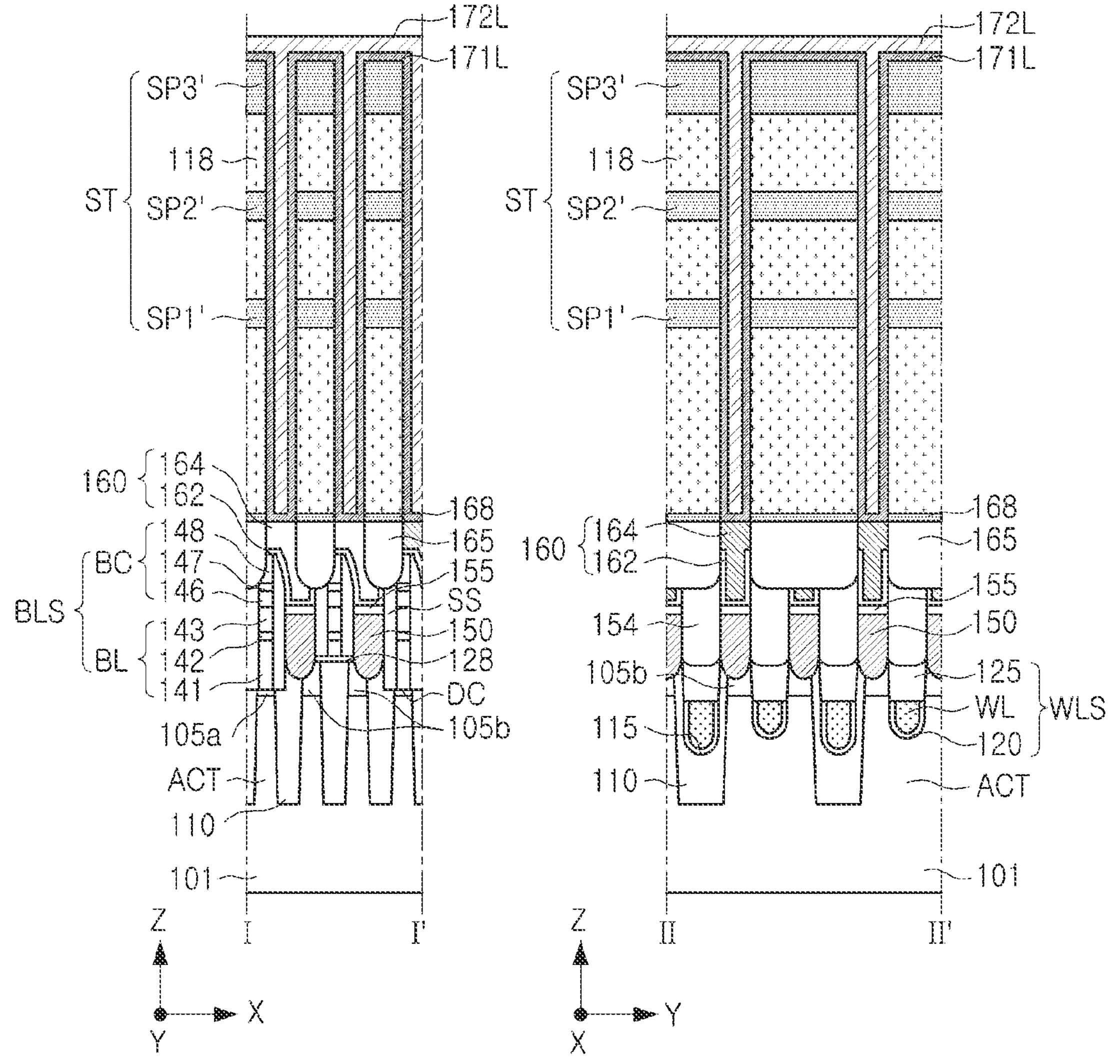

Referring to FIG. 6C, a first preliminary electrode layer 171L and a preliminary insertion layer 172L may be formed in the plurality of holes HL1. For example, the first preliminary electrode layer 171L may be formed in the plurality of holes HL1 and the preliminary insertion layer 172L may be formed on the first preliminary electrode layer 171L in the plurality of holes.

The first preliminary electrode layer 171L may be formed along the surface of the stack structure ST and the upper surfaces of the upper conductive patterns 160 exposed by the plurality of holes HL1. The first preliminary electrode layer 171L may be formed of a conductive material. The first preliminary electrode layer 171L may be formed of at least one of for example, polycrystalline silicon (Si), TiN, NbN, WN, VN, MoN, TaN, TiSiN and TiCN. In example embodiments, the process of forming the first preliminary electrode layer 171L may be performed by atomic layer deposition (ALD) or chemical vapor deposition (CVD).

The preliminary insertion layer 172L may be formed on the first preliminary electrode layer 171L. In an embodiment, the preliminary insertion layer 172L is formed of a material containing fluorine (F) among halogen elements. In example embodiments, when the preliminary insertion layer 172L is formed of a material containing fluorine (F), fluorine (F) is diffused into a dielectric layer (refer to FIG. 2) 180 to be described later, so that the dielectric layer 180 may include fluorine (F). For example, the preliminary insertion layer 172L may include at least one of a metal, a metal nitride, and an oxide layer, and in detail, may include at least one of W, Ta, Sn, WN, TaN, SnN, and SiOF, and the metal, metal nitride, and oxide films may include fluorine (F). In example embodiments, a process of forming the preliminary insertion layer 172L may be performed by atomic layer deposition (ALD) or chemical vapor deposition (CVD). However, the process of forming the preliminary insertion layer 172L is not limited thereto.

Figure 6D:
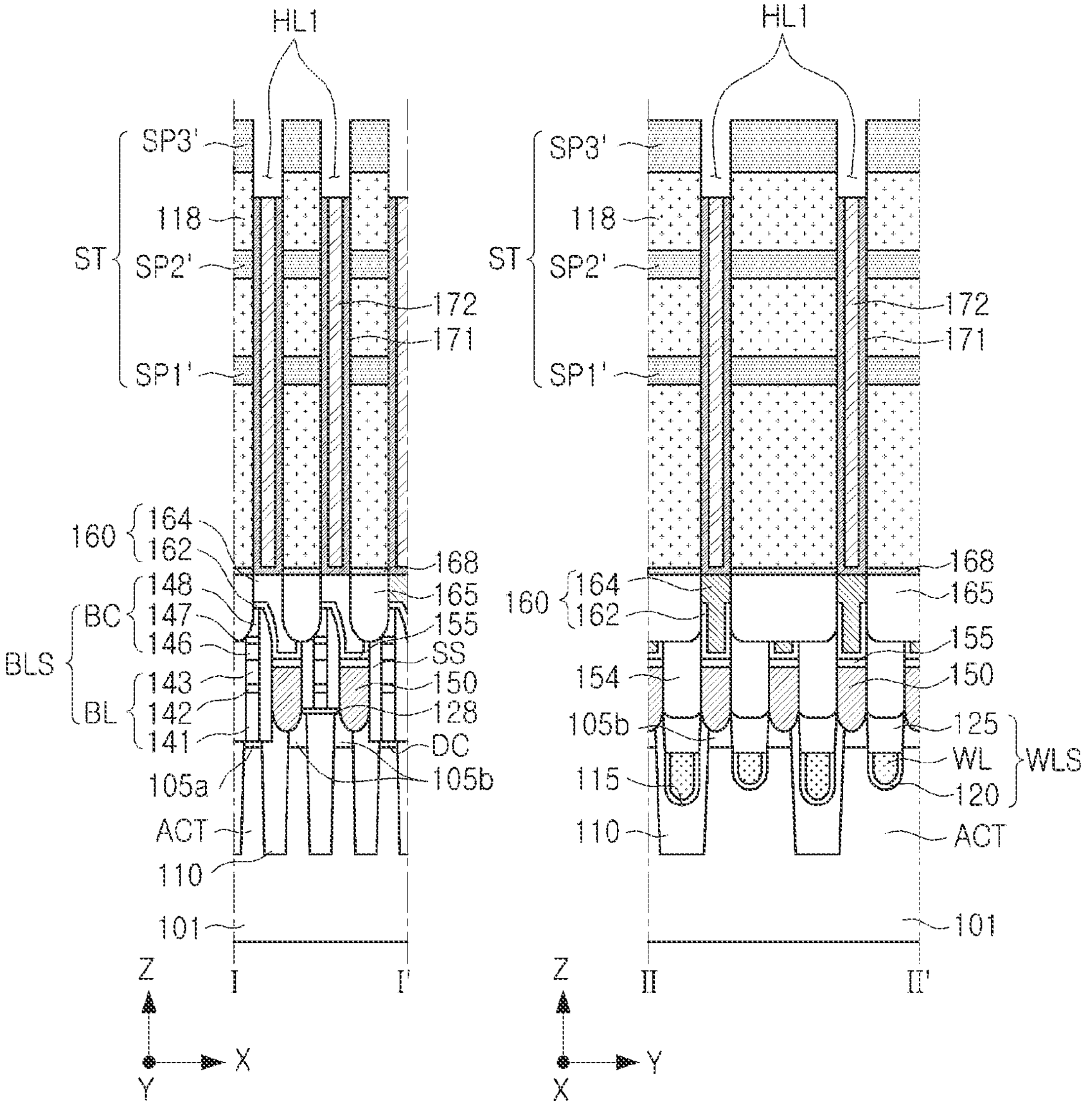

Referring to FIG. 6D, a first electrode layer 171 and an insertion layer 172 may be formed inside the plurality of holes HL1.

The first electrode layer 171 and the insertion layer 172 may be formed by etching portions of the first preliminary electrode layer (171L in FIG. 6C) and the preliminary insertion layer (172L in FIG. 6C). The first electrode layer 171 and the insertion layer 172 may be etched to have upper ends positioned at a level lower than the upper surface of the stack structure ST. The first electrode layer 171 may have a sealed shape, and the insertion layer 172 may have a pillar shape completely filling an internal space defined by the first electrode layer 171. For example, the sealed shape may completely surround sides and a bottom surface of the pillar shape. In example embodiments, the upper end of the first electrode layer 171 may be positioned at substantially the same level as the upper end of the insertion layer 172, but is not limited thereto.

Figure 6E:
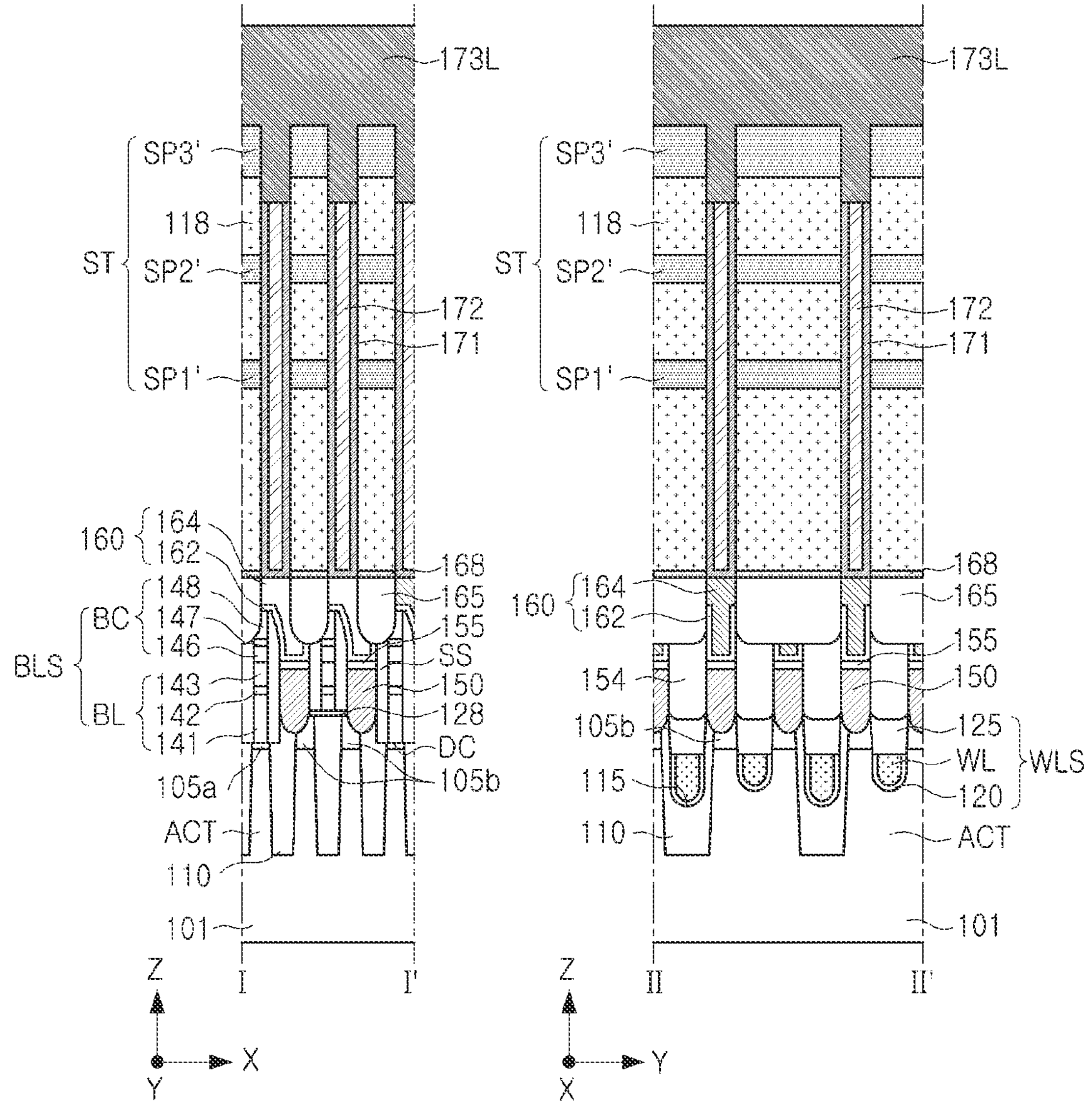

Referring to FIG. 6E, a second preliminary electrode layer 173L covering the first electrode layer 171, the insertion layer 172, and the stacked structure ST may be formed.

The second preliminary electrode layer 173L may be formed to fill the plurality of holes HL1 and cover the upper surface of the stack structure ST. The second preliminary electrode layer 173L may cover upper surfaces of the first electrode layer 171 and the insertion layer 172. For example, the second preliminary electrode layer 173L may cover and upper surface of the pillar shaped portion of the first electrode layer 171. The second preliminary electrode layer 173L may be formed of a conductive material. The first preliminary electrode layer 171L may be formed of at least one of, for example, polycrystalline silicon (Si), TiN, NbN, WN, VN, MoN, TaN, TiSiN and TiCN. In example embodiments, the process of forming the second preliminary electrode layer 173L may be performed by atomic layer deposition (ALD) or chemical vapor deposition (CVD). The second preliminary electrode layer 173L may include the same material as or a different material from the first electrode layer 171.

Figure 6F:
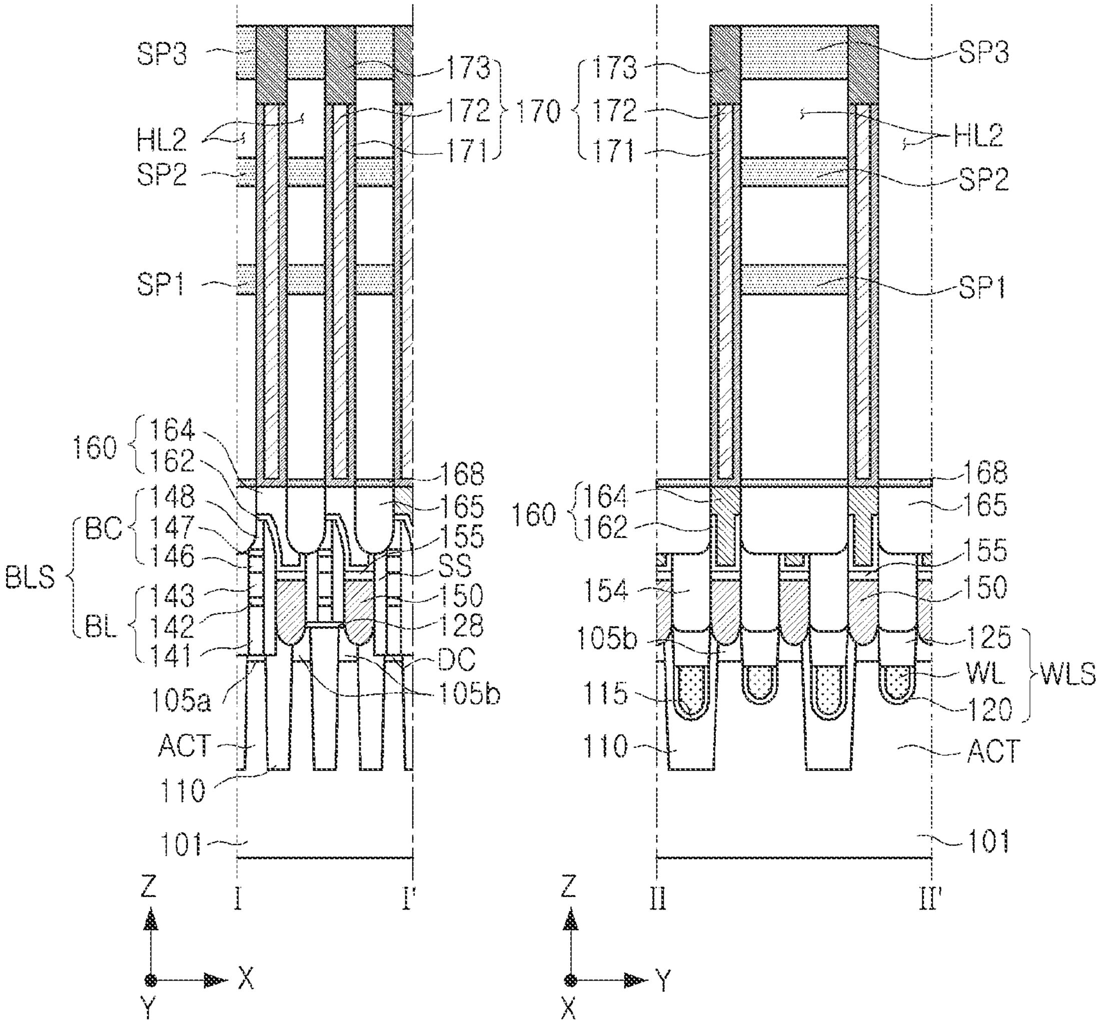

Referring to FIG. 6F, the second electrode layer 173 may be formed and the mold layers 118 may be removed.

A portion of the second preliminary electrode layer (173L in FIG. 6E) may be etched to form the second electrode layer 173 to have an upper surface positioned at the same level as the upper surface of the third support layer SP3. For example, the portion may be removed by the etching to form the second electrode layer 173. Accordingly, lower electrodes 170 including the first electrode layer 171, the insertion layer 172, and the second electrode layer 173 may be formed. In example embodiments, the second electrode layer 173 may be etched to have an upper surface positioned at the same level as the upper surface of the uppermost third support layer SP3. However, the shape of the second electrode layer 173 is not limited thereto. In other embodiments, the upper surface of the second electrode layer 173 may be positioned at a lower level than the upper surface of the third support layer SP3 or at higher level than the upper surface.

Thereafter, a separate mask is formed on the second preliminary electrode layer (173L in FIG. 6E), and at least a portion of the mold layers (118 of FIG. 6E) and the preliminary support layers (SP1', SP2', and SP3' of FIG. 6E) may be removed using the mask. Accordingly, the preliminary support layers (SP1', SP2', and SP3' in FIG. 6E) may be formed of the first to third support layers SP1, SP2, and SP3. The first to third support layers SP1, SP2, and SP3 may be patterned according to the structure of the mask to have a shape including a plurality of openings. As illustrated in FIG. 1A, the plurality of openings are disposed between four adjacent lower electrodes 170, or as illustrated in FIGS. 1B and 1C, may be disposed between three adjacent lower electrodes 170. The first to third support layers SP1, SP2, and SP3 may connect adjacent lower electrodes 170 to each other. The mold layers 118 may be selectively removed with respect to the support layers SP1, SP2, and SP3. In an example embodiment, the process of removing mold layers 118 is performed by a wet etching process using an etchant (e.g., a hydrogen fluoride (HF) solution). The mask may be removed after etching the mold layers 118 or while the mold layers 118 are being etched. An empty space HL2 may be formed in an area where the mold layers 118 are removed. For example, the removal of the mold layer 118 may leave an empty space HL2.

Referring back to FIGS. 1A, 2 and 3A to 3C, a dielectric layer 180 covering the lower electrodes 170 is formed, and an upper electrode 190 covering the dielectric layer 180 and a plate electrode 200 on the upper electrode 190 may be formed. A process of forming the dielectric layer 180 may be performed by atomic layer deposition (ALD) or chemical vapor deposition (CVD), respectively. The process of forming the upper electrode 190 and the plate electrode 200 may be performed by atomic layer deposition (ALD), chemical vapor deposition (CVD), or physical vapor deposition (PVD). Accordingly, an information storage structure (CAP) including the lower electrodes 170, the dielectric layer 180, the upper electrode 190, and the plate electrode 200 is formed, and the semiconductor device 100 including the information storage structure (CAP) may be manufactured.

FIGS. 7A to 7D are cross-sectional views illustrating a method of manufacturing a semiconductor device according to an example embodiment. FIGS. 7A to 7D illustrate an example embodiment of a manufacturing method for manufacturing the semiconductor device of FIG. 4A, and illustrate sections corresponding to I-I' and II-II' in FIG. 2 are illustrated.

First, the same process as the above-described FIGS. 6A and 6B is performed.

Figure 7A:
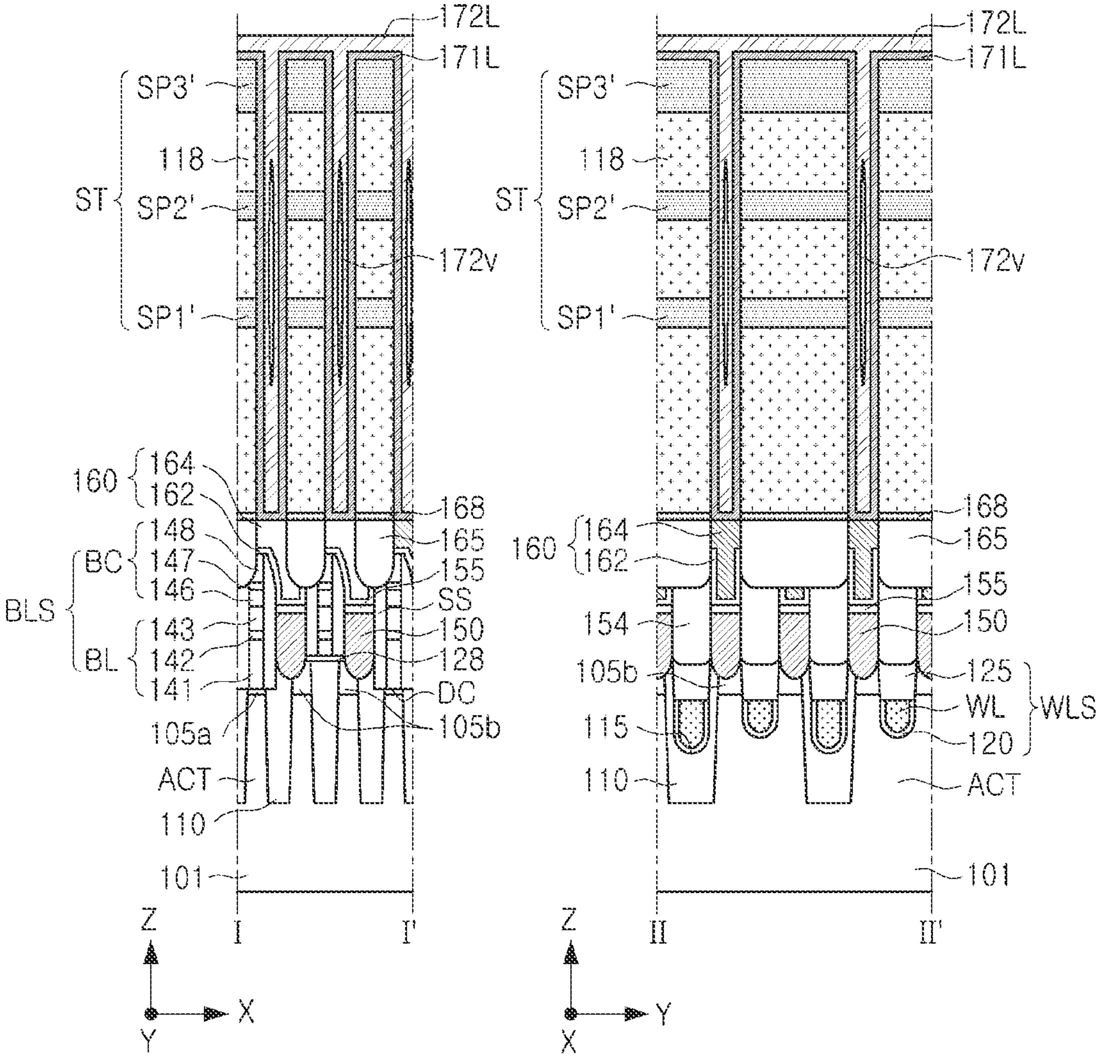
FIGS. 7A, 7B, 7C and 7D are schematic cross-sectional views illustrating a method of manufacturing a semiconductor device according to an example embodiment.

Next, referring to FIG. 7A, a first preliminary electrode layer 171L and a preliminary insertion layer 172L are formed in the plurality of holes HL1. For example, the first preliminary electrode layer 171L is formed in the holes HL1 and the preliminary insertion layer 172L is formed on the first preliminary electrode layer 171L in the holes HL1. However, unlike FIG. 6C, a void 172*v* is formed in the preliminary insertion layer 172L. For example, the void 172*v* may be formed due to process reasons. For example, the void 172*v* may be a pocket or gap devoid of solid material but including a gas.

In the process of forming the preliminary insertion layer 172L, voids 172*v* may be formed due to step coverage characteristics. The void 172*v* may contain air or a gas formed of a material used in a manufacturing process of the semiconductor device 100*a*. The void 172*v* may be completely filled by the second preliminary electrode layer 173L in a process of forming the second preliminary electrode layer 173L (see FIG. 7C) described below.

Figure 7B:
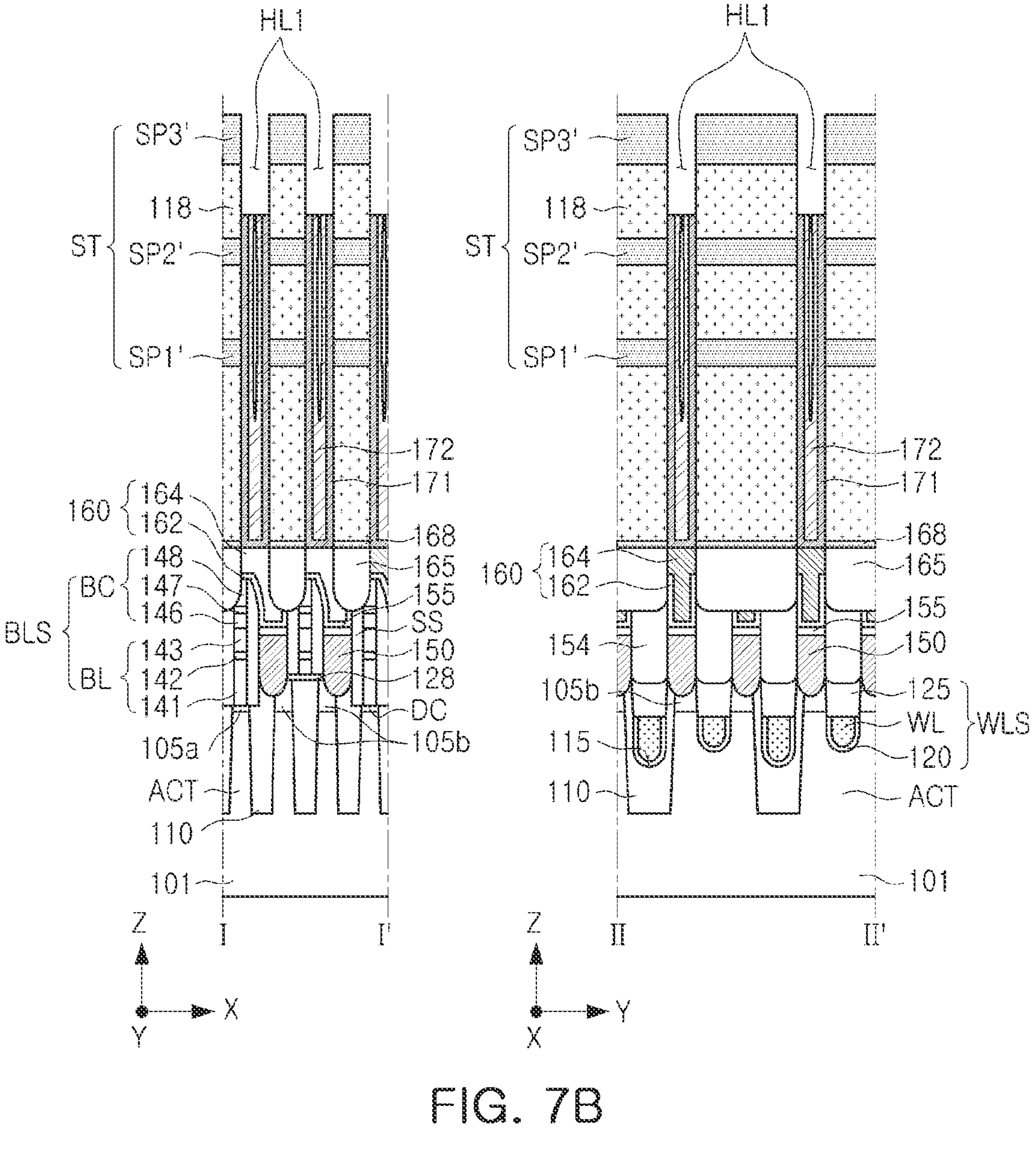

Referring to FIG. 7B, a first electrode layer 171 and an insertion layer 172 may be formed inside the plurality of holes HL1.

The first electrode layer 171 and the insertion layer 172 may be formed by etching portions of the first preliminary electrode layer (171L in FIG. 6C) and the preliminary insertion layer (172L in FIG. 6C). The first electrode layer 171 and the insertion layer 172 may be etched to have upper ends positioned at a level lower than the upper surface of the stack structure ST. Through the etching process, the preliminary insertion layer 172L (see FIG. 7A) is removed on the void 172*v* (see FIG. 7A), the upper portion of the void 172*v* becomes open, and a plurality of holes HL1 may be formed.

Each of the first electrode layer 171 and the insertion layer 172 may have a cylindrical shape. In an example embodiment, the upper end of the first electrode layer 171 is positioned at the same or substantially the same level as the upper end of the insertion layer 172, but is not limited thereto.

Figure 7C:
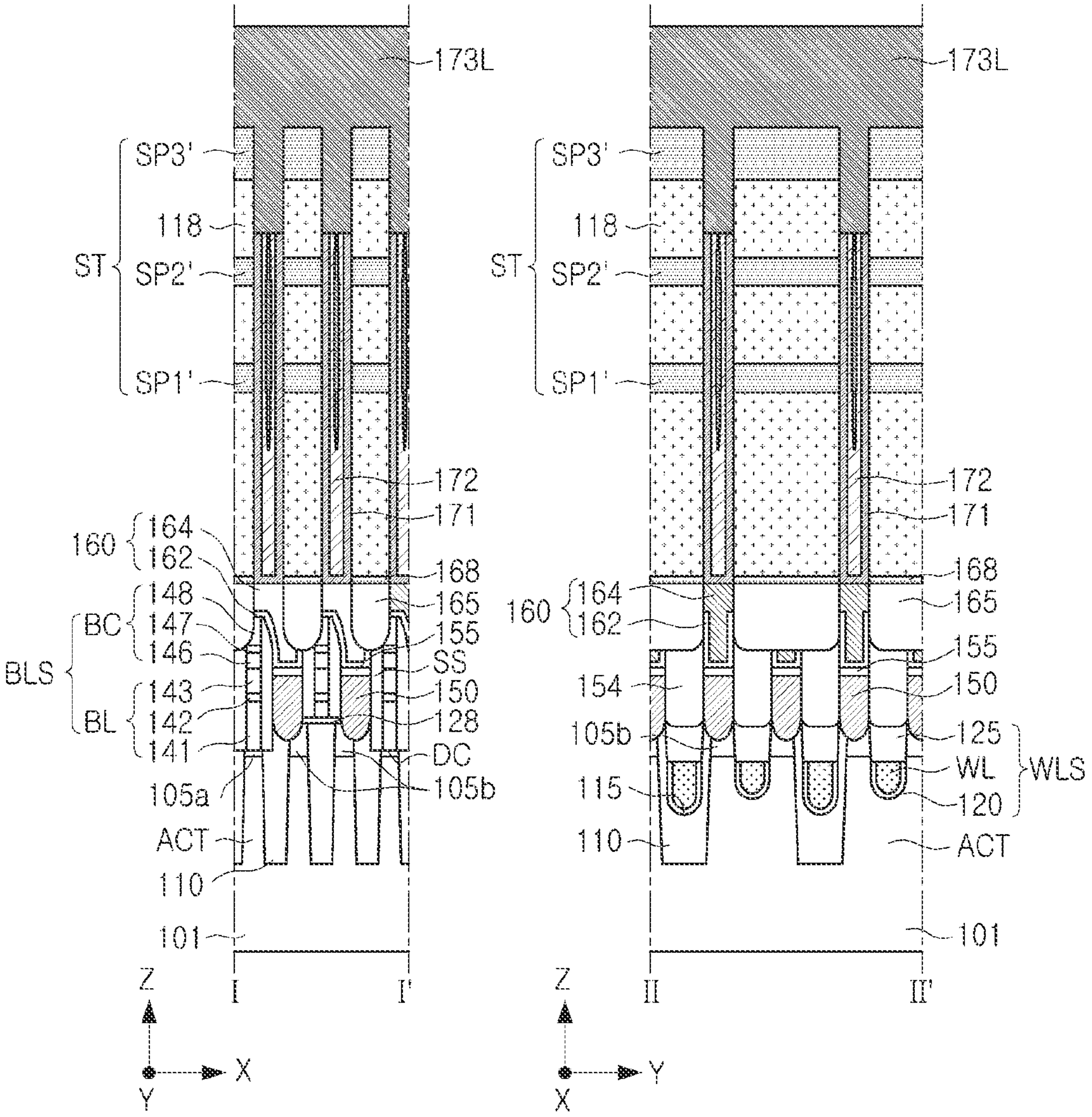

Referring to FIG. 7C, a second preliminary electrode layer 173L covering the first electrode layer 171, the insertion layer 172, and the stacked structure ST may be formed.

The second preliminary electrode layer 173L may be formed by filling the plurality of holes HL1 including the empty space defined by the cylindrical shape of the insertion layer 172 and covering the upper surface of the stacked structure ST. The second preliminary electrode layer 173L may cover upper ends of the first electrode layer 171 and the insertion layer 172. The second preliminary electrode layer 173L may have a T shape. The second preliminary electrode layer 173L may be formed of a conductive material. The first preliminary electrode layer 171L may be formed of at least one of, for example, polycrystalline silicon (Si), TiN, NbN, WN, VN, MoN, TaN, TiSiN, and TiCN. In example embodiments, the process of forming the second preliminary electrode layer 173L may be performed by atomic layer deposition (ALD) or chemical vapor deposition (CVD). The second preliminary electrode layer 173L may include the same material as or a different material from the first electrode layer 171.

Figure 7D:
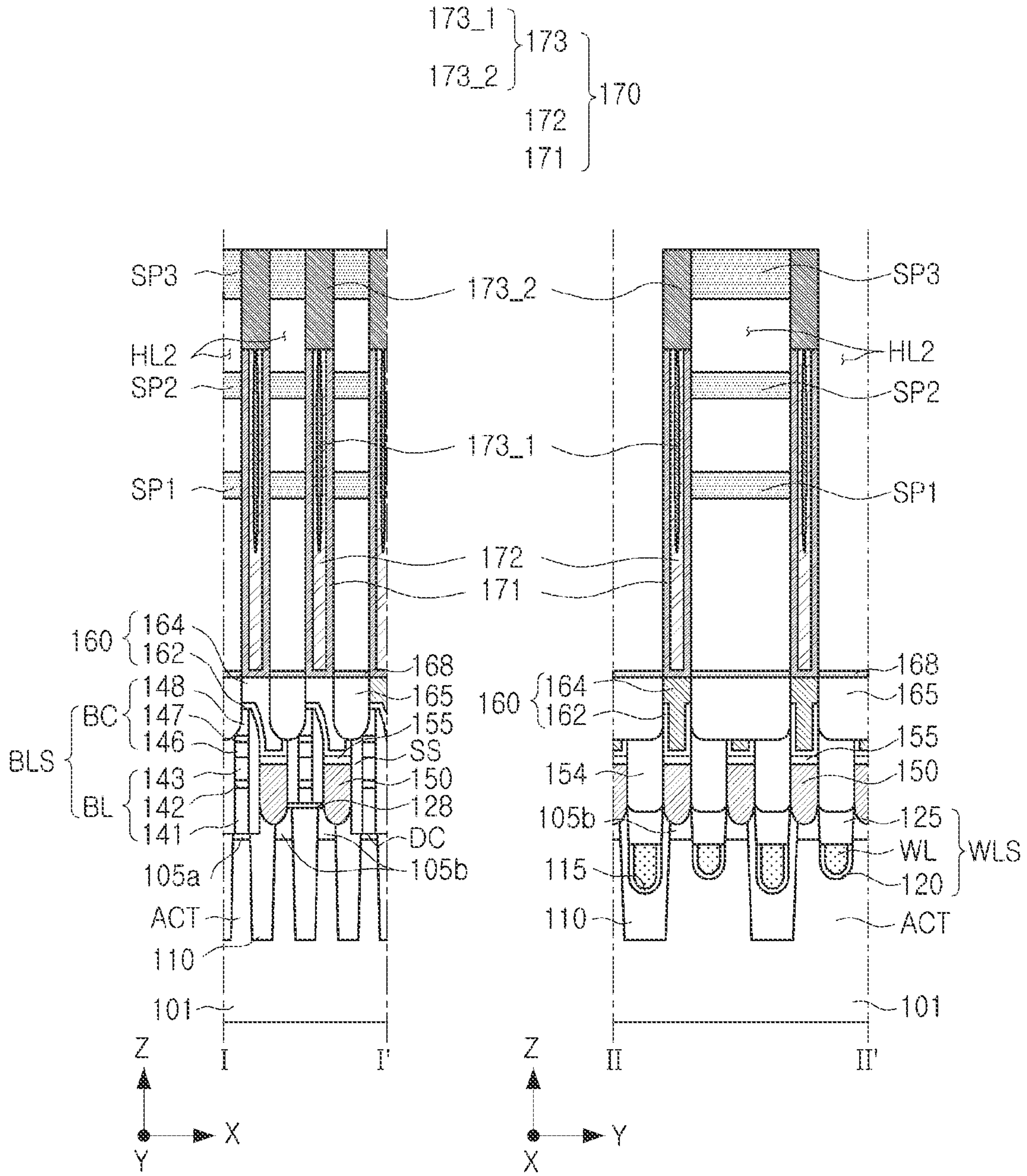

Referring to FIG. 7D, the second electrode layer 173 may be formed and the mold layers 118 may be removed.

The second electrode layer 173 including the first portion 173_1 and the second portion 173_2 may be formed by etching a portion of the second preliminary electrode layer (173L in FIG. 7C). Accordingly, lower electrodes 170 including the first electrode layer 171, the insertion layer 172, and the second electrode layer 173 may be formed. In an example embodiment, the second electrode layer 173 is etched to have an upper surface positioned at the same level as the upper surface of the uppermost third support layer SP3. However, the shape of the second electrode layer 173 is not limited to this.

Next, the same process as that of FIG. 6F may be performed to form the first to third support layers SP1, SP2, and SP3.

Next, referring again to FIGS. 1A, 2, and 4A to 4C, a dielectric layer 180 covering the lower electrodes 170 may be formed, and an upper electrode 190 covering the dielectric layer 180 and a plate electrode 200 on the upper electrode 190 may be formed. Accordingly, an information storage structure (CAP) including the lower electrodes 170, the dielectric layer 180, the upper electrode 190, and the plate electrode 200 is formed, and the semiconductor device 100*a* including the information storage structure (CAP) may be manufactured.

As set forth above, a semiconductor device according to an example embodiment includes a lower electrode in which an insertion layer containing fluorine (F) is inserted between electrode layers, and an information storage structure including a dielectric layer doped with fluorine (F). Accordingly, leakage current of the information storage structure may be prevented.

While example embodiments have been illustrated and described above, it will be apparent to those skilled in the art that modifications and variations could be made without departing from the scope of the present inventive concept.

What is claimed is:

1. A semiconductor device comprising:

a substrate;

a plurality of lower electrodes disposed on the substrate;

a dielectric layer covering the lower electrodes and including a halogen element; and an upper electrode covering the dielectric layer, wherein each of the plurality of lower electrodes comprises:

a first electrode layer;

an insertion layer disposed on the first electrode layer; and a second electrode layer disposed on the first electrode layer and the insertion layer, wherein the insertion layer includes an insertion material including a halogen element, wherein the first electrode layer is disposed between the dielectric layer and the insertion layer, and wherein the dielectric layer is disposed between the first electrode layer and the upper electrode.

2. The semiconductor device of claim 1, wherein the halogen element of the dielectric layer and the halogen element of the insertion layer are fluorine (F).

3. The semiconductor device of claim 2, wherein the insertion material of the insertion layer further comprises at least one of a conductive material and a dielectric material, wherein the conductive material of the insertion layer includes at least one of W, Ta, Sn, WN, TaN and SnN, and wherein the dielectric material of the insertion layer comprises silicon oxide.

4. The semiconductor device of claim 2, wherein the first electrode layer includes at least one of polycrystalline silicon (Si), TiN, NbN, WN, VN, MoN, TaN, TiSiN, and TiCN, and wherein the second electrode layer includes at least one of polycrystalline silicon (Si), TiN, NbN, WN, VN, MON, TaN, TiSiN, and TiCN.

5. The semiconductor device of claim 1, wherein the insertion layer is surrounded by the first electrode layer and the second electrode layer.

6. The semiconductor device of claim 1, wherein the first electrode layer covers a lower end of the insertion layer and a side surface of the insertion layer, and wherein the second electrode layer covers an upper end of the first electrode layer and an upper end of the insertion layer.

7. The semiconductor device of claim 1, wherein an outer side surface of the second electrode layer includes a portion vertically aligned with an outer side surface of the first electrode layer.

8. The semiconductor device of claim 1, wherein the second electrode layer includes an extension portion extending into the insertion layer and a pillar portion covering an upper end of the first electrode layer and an upper end of the insertion layer.

9. The semiconductor device of claim 8, wherein the extension portion of the second electrode layer extends from the pillar portion of the second electrode layer.

10. The semiconductor device of claim 8, wherein the insertion layer covers a lower end of the extension portion of the second electrode layer and surrounds a side surface of the extension portion of the second electrode layer.

11. The semiconductor device of claim 1, wherein the insertion layer has a pillar shape completely filling an internal space defined by the first electrode layer.

12. The semiconductor device of claim 1, wherein the insertion layer is spaced apart from the dielectric layer by the first electrode layer and the second electrode layer.

13. The semiconductor device of claim 1, further comprising a support structure in contact with the plurality of lower electrodes, wherein the support structure includes an uppermost support layer and a next higher support layer on a level lower than the uppermost support layer, and wherein an upper end of the first electrode layer and an upper end of the insertion layer are located on a level between a lower surface of the uppermost support layer and an upper surface of the next higher support layer.

14. The semiconductor device of claim 1, wherein a material of the first electrode layer is different from a material of the second electrode layer.

15. A semiconductor device comprising:

a substrate;

a plurality of lower electrodes disposed on the substrate;

a dielectric layer covering the lower electrodes; and an upper electrode covering the dielectric layer, wherein each of the plurality of lower electrodes comprises:

a first electrode layer including a halogen element in a first concentration;

a second electrode layer disposed on the first electrode layer; and an insertion layer disposed between the first electrode layer and the second electrode layer and surrounded by the first electrode layer and the second electrode layer, and including a halogen element of a second concentration higher than the first concentration, wherein the first electrode layer is disposed between the dielectric layer and the insertion layer, and wherein the dielectric layer is disposed between the first electrode layer and the upper electrode.

16. The semiconductor device of claim 15, wherein the dielectric layer includes a halogen element at a third concentration higher than the first concentration.

17. The semiconductor device of claim 16, wherein the halogen element of the first electrode layer, the halogen element of the insertion layer, and the halogen element of the dielectric layer are fluorine (F).

18. The semiconductor device of claim 15, wherein the insertion layer has an outer side surface in contact with the first electrode layer and an inner side surface defining an internal space, and the second electrode layer includes an extension portion within the internal space and contacting the inner side surface of the insertion layer, and a pillar portion extending from the extension portion and contacting an upper end of the insertion layer and an upper end of the first electrode layer.

19. A semiconductor device comprising:

a device isolation layer defining a plurality of active regions disposed on a substrate;

a plurality of gate electrodes crossing the active regions and extending into the device isolation layer;

a plurality of first impurity regions and a plurality of second impurity regions disposed in the active regions, on both sides of the gate electrodes;

a plurality of bit lines disposed on the gate electrodes and electrically connected to the first impurity regions;

a plurality of conductive patterns disposed on side surfaces of the bit lines and electrically connected to the second impurity regions;

a plurality of lower electrodes extending vertically on the conductive patterns and electrically connected to the respective conductive patterns;

at least one support layer spaced apart from an upper surface of the substrate in a vertical direction, extending in a direction parallel to the upper surface of the substrate, and contacting respective side surfaces of the plurality of lower electrodes adjacent to each other;

a dielectric layer covering the lower electrodes and the at least one support layer, and including fluorine (F); and an upper electrode covering the dielectric layer, wherein each of the lower electrodes comprises:

a first electrode layer;

an insertion layer buried in the first electrode layer and including fluorine (F); and a second electrode layer on an upper surface of the insertion layer, and covering an upper surface of the first electrode layer and the upper surface of the insertion layer.

20. The semiconductor device of claim 19, wherein the at least one support layer includes a lower support layer and an upper support layer on a level higher than a level of the lower support layer, wherein the lower support layer is in contact with the first electrode layer and spaced apart from the insertion layer, and wherein the upper support layer is in contact with the second electrode layer.

* * * * *